(12) United States Patent
Kimoto et al.

(10) Patent No.: US 8,765,355 B2
(45) Date of Patent: Jul. 1, 2014

(54) RADIATION SENSITIVE RESIN COMPOSITION, METHOD FOR FORMING A PATTERN, POLYMER AND COMPOUND

(75) Inventors: Takakazu Kimoto, Tokyo (JP); Mitsuo Sato, Tokyo (JP); Yusuke Asano, Tokyo (JP); Tomohiro Kakizawa, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 13/459,023

(22) Filed: Apr. 27, 2012

(65) Prior Publication Data
US 2012/0276482 A1    Nov. 1, 2012

(30) Foreign Application Priority Data
Apr. 28, 2011  (JP) .................................. 2011-102492

(51) Int. Cl.
| G03F 7/039 | (2006.01) |
| G03F 7/30 | (2006.01) |
| C08F 12/20 | (2006.01) |

(52) U.S. Cl.
USPC ................. 430/270.1; 430/326; 526/242

(58) Field of Classification Search
None
See application file for complete search history.

(56) References Cited

U.S. PATENT DOCUMENTS

| 4,491,628 | A | | 1/1985 | Ito et al. |
| 5,360,876 | A | * | 11/1994 | Burgoyne et al. ............ 525/374 |
| 5,374,681 | A | * | 12/1994 | Kroner et al. .................. 525/79 |
| 5,744,537 | A | * | 4/1998 | Brunsvold et al. ............ 524/520 |
| 2005/0277059 | A1 | * | 12/2005 | Kanda ....................... 430/270.1 |
| 2007/0134590 | A1 | * | 6/2007 | Fukuhara et al. .......... 430/270.1 |
| 2007/0178405 | A1 | * | 8/2007 | Kanda et al. ............... 430/270.1 |
| 2008/0090173 | A1 | * | 4/2008 | Harada et al. ............. 430/270.1 |
| 2009/0047602 | A1 | * | 2/2009 | Furuya et al. ............. 430/285.1 |
| 2009/0202943 | A1 | * | 8/2009 | Ohsawa et al. ............ 430/285.1 |
| 2009/0202945 | A1 | * | 8/2009 | Nakagawa et al. ........ 430/286.1 |
| 2009/0311627 | A1 | * | 12/2009 | Kurosawa et al. ......... 430/286.1 |
| 2010/0221659 | A1 | * | 9/2010 | Ebata et al. ............... 430/270.1 |
| 2010/0233636 | A1 | * | 9/2010 | Kuramoto ................... 430/325 |
| 2010/0255416 | A1 | * | 10/2010 | Kouno et al. .............. 430/270.1 |
| 2011/0223537 | A1 | * | 9/2011 | Ebata et al. ............... 430/270.1 |

FOREIGN PATENT DOCUMENTS

| EP | 2479 614 A1 | * | 7/2012 | |
| JP | 59-45439 | | 3/1984 | |
| JP | 06-12452 B | | 5/1984 | |
| JP | 59-93448 | | 5/1984 | |
| JP | 05-188598 | | 7/1993 | |
| JP | 2003-183226 | | 7/2003 | |
| JP | 2005-352384 | | 12/2005 | |
| JP | 2006-276458 | | 10/2006 | |
| JP | 2007-279664 | | 10/2007 | |
| JP | 2007-304537 | | 11/2007 | |
| JP | 2008-088343 | | 4/2008 | |
| JP | 2009-134088 | | 6/2009 | |
| JP | 2009-139909 | | 6/2009 | |
| JP | 2009-217253 | | 9/2009 | |
| JP | 2009-271442 | | 11/2009 | |
| JP | 2010-020284 | | 1/2010 | |
| JP | 2010-032994 | | 2/2010 | |
| JP | 2010-066503 | | 3/2010 | |
| JP | 2010-210953 | | 9/2010 | |
| WO | WO 2007/116664 | | 10/2007 | |
| WO | WO 2009/041270 | | 4/2009 | |
| WO | WO 2009/051088 | | 4/2009 | |
| WO | WO-2010/114158 A1 | * | 10/2010 | ............. G03F 7/075 |
| WO | WO-2010/114176 A1 | * | 10/2010 | ............. G03F 7/039 |
| WO | WO 2011/034176 A1 | * | 3/2011 | |
| WO | WO-2011/145702 A1 | * | 11/2011 | |
| WO | WO-2011/147703 A1 | * | 11/2011 | |

OTHER PUBLICATIONS

International Search Report for corresponding International Application No. PCT/JP2011/061587, Jun. 21, 2011.
International Search Report for corresponding International Application No. PCT/JP2011/061588, Aug. 16, 2011.

* cited by examiner

*Primary Examiner* — Cynthia Hamilton
(74) *Attorney, Agent, or Firm* — Ditthavong & Steiner, P.C.

(57) ABSTRACT

A radiation sensitive resin composition includes a first polymer having a group represented by a following formula (1), and a radiation sensitive acid generator. n is an integer of 2 to 4. X represents a single bond or a bivalent organic group. A represents a (n+1) valent linking group. Each Q independently represents a group that includes an alkali-dissociable group.

(1)

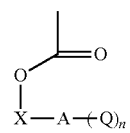

7 Claims, No Drawings

RADIATION SENSITIVE RESIN COMPOSITION, METHOD FOR FORMING A PATTERN, POLYMER AND COMPOUND

CROSS-REFERENCE TO RELATED APPLICATIONS

The present application claims priority under 35 U.S.C. §119 to Japanese Patent Application No. 2011-102492, filed Apr. 28, 2011. The contents of this application are incorporated herein by reference in their entirety.

BACKGROUND OF THE INVENTION

1. Field of the Invention

The present invention relates to a radiation sensitive resin composition, a method for forming a pattern, a polymer and a compound.

2. Discussion of the Background

Miniaturization of various types of electronic device structure such as semiconductor devices and liquid crystal devices has been accompanied by demands for miniaturization of resist patterns in lithography processes. Although fine resist patterns having a line width of about 90 nm can be formed using, for example, ArF excimer laser at present, future finer pattern formation is required.

In such pattern formation, a chemically amplified resin composition has been conventionally used extensively. The chemically amplified resin composition contains an acid generating component that generated an acid upon exposure, and a resin component whose solubility in developer solutions varies by the action of this acid (see Japanese Unexamined Patent Application, Publication No. S59-45439), whereby a pattern can be formed using the difference of rates of dissolution between a site exposed with light and a sites unexposed with light.

On the other hand, a liquid immersion lithography technique was developed for resist pattern formation. It is reported that high resolving abilities can be attained according to the liquid immersion lithography, even if a light source of the same exposure wavelength is employed, similarly to the case in which a light source of a shorter wavelength is employed in conventional resist pattern formation. Thus, liquid immersion lithography has drawn attention as a technique that achieves high resolution in manufacturing semiconductor elements which require a large amount of investment in equipment while suppressing increase in costs. As a resin composition suited for the liquid immersion lithography, in attempts to be capable of inhibiting elution of an acid generator and the like from a resist film to a liquid for liquid immersion lithography, and improving water break of the resist film, and the like, a resin composition was proposed which contains a highly hydrophobic polymer including fluorine atoms (see PCT International Publication No. 2007/116664).

Resin compositions that are hydrophobic during liquid immersion lithography but the hydrophobicity decreases upon development with alkali were proposed. For example, a resin composition containing a polymer including fluorine atoms that has an acid-dissociable bivalent linking group, and an alkali-dissociable group has been known (see Japanese Unexamined Patent Application, Publication No. 2010-020284). In addition, a resin composition in which a polymer having an alkali-dissociable group and a fluorocarboxylic acid structure is used as a water repellent resin has been known (see Japanese Unexamined Patent Application, Publication No. 2010-210953).

SUMMARY OF THE INVENTION

According to one aspect of the present invention, a radiation sensitive resin composition includes a first polymer having a group represented by a following formula (1), and a radiation sensitive acid generator.

In the formula (1), n is an integer of 2 to 4. X represents a single bond or a bivalent organic group. A represents a (n+1) valent linking group. Each Q independently represents a group that includes an alkali-dissociable group.

According to another aspect of the present invention, a method for forming a pattern includes forming a resist firm by applying the radiation sensitive resin composition on a substrate. At least a part of the resist film is exposed by irradiating with a radioactive ray by liquid immersion lithography. The exposed resist film is heated. The heated resist film is developed.

According to further aspect of the present invention, a polymer includes a group represented by a following formula (1).

In the formula (1), n is an integer of 2 to 4. X represents a single bond or a bivalent organic group. A represents a (n+1) valent linking group. Each Q independently represents a group that includes an alkali-dissociable group.

According to further aspect of the present invention, a compound is represented by a following formula (0).

In the formula (0), n is an integer of 2 to 4. X represents a single bond or a bivalent organic group. A represents a (n+1) valent linking group. Each Q independently represents a group that includes an alkali-dissociable group. $R^1$ represents a hydrogen atom, a fluorine atom, a methyl group, or a trifluoromethyl group.

DESCRIPTION OF THE EMBODIMENTS

According to an embodiment of the invention, a radiation sensitive resin composition contains (A) a polymer (hereinafter, may be also referred to as "polymer (A)") having a group represented by the following formula (1):

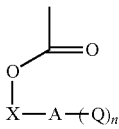

(1)

in the formula (1), n is an integer of 2 to 4; X represents a single bond or a bivalent organic group; A represents a (n+1) valent linking group (i.e., a linking group having a valency of (n+1)); and Q included in multiple numbers each independently represents a group that includes an alkali-dissociable group, and (B) a radiation sensitive acid generator (hereinafter, may be also referred to as "acid generator (B)").

The group represented by the above formula (1) includes a plurality of alkali-dissociable groups. Thus, since the radiation sensitive resin composition contains (A) a polymer having the group represented by the above formula (1), affinity to a developer solution can be improved upon alkali development while securing the hydrophobicity during liquid immersion lithography, and as a result, inhibition of occurrence of development defects such as blob defects is enabled. It is to be noted that the term "alkali-dissociable group" as referred to herein means a group that dissociates to generate a polar group under conditions of the treatment with an alkaline developer employed in a pattern formation step.

"A" in the above formula (1) preferably represents an alicyclic group having 4 to 20 carbon atoms, or a chain hydrocarbon group having 1 to 20 carbon atoms. Due to the "A" being a group having the aforementioned specific structure, a higher alkali dissociability of the alkali-dissociable group included in the group represented by the above formula (1) is attained, and thus the radiation sensitive resin composition can further improve the affinity to a developer solution upon alkali development while securing the hydrophobicity during liquid immersion lithography. As a result, the radiation sensitive resin composition can further inhibit occurrence of development defects such as blob defects.

Q in the above formula (1) is preferably a group represented by the following formula (2-1) or (2-2):

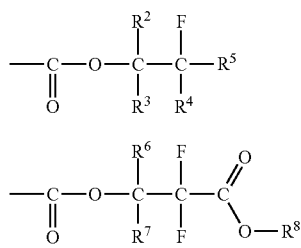

in the formula (2-1), $R^2$ and $R^3$ each independently represent a hydrogen atom or a hydrocarbon group having 1 to 10 carbon atoms; $R^4$ represents a hydrogen atom, a fluorine atom or a hydrocarbon group having 1 to 10 carbon atoms; $R^5$ represents a fluorine atom or a monovalent organic group, wherein a part or all of hydrogen atoms included in the hydrocarbon group of $R^2$, $R^3$ and $R^4$ and the monovalent organic group included in $R^5$ may be substituted, and
in the formula (2-2), $R^6$ and $R^7$ each independently represent a hydrogen atom or a chain hydrocarbon group having 1 to 10 carbon atoms; and $R^8$ represents a monovalent organic group.

When "Q" in the above formula (1) is a group represented by the above formula (2-1) or (2-2), the radiation sensitive resin composition can achieve both storage stability and high alkali dissociability. Therefore, the radiation sensitive resin composition can further improve affinity to a developer solution upon alkali development while securing the hydrophobicity during liquid immersion lithography, and as a result, occurrence of development defects such as blob defects can be further inhibited.

The content of structural units having the group represented by the above formula (1) with respect to entire structural units that constitute the polymer (A) is preferably no less than 5 mol %. When the content of structural units having the group represented by the above formula (1) in the polymer (A) is no less than 5 mol %, the radiation sensitive resin composition can enhance the aforementioned effect.

It is preferred that the radiation sensitive resin composition further contains (C) a base polymer having an acid-dissociable group (hereinafter, may be also referred to as "polymer (C)"). The radiation sensitive resin composition can improve radiosensitivity of the resulting resist film due to containing the polymer (C).

The method for forming a pattern of an embodiment of the present invention includes:

(1) a resist film formation step of forming a resist film by applying the radiation sensitive resin composition according to any one of claims 1 to 5 on a substrate;

(2) an exposure step of exposing at least a part of the resist film by irradiating with a radioactive ray by liquid immersion lithography;

(3) a heating step of heating the exposed resist film; and (4) a development step of developing the heated resist film.

According to the method for forming a pattern, occurrence of development defects such as bridge defects is inhibited, whereby formation of a fine pattern having an excellent shape is enabled.

The polymer of an embodiment of the present invention has a group represented by the following formula (1):

in the formula (1), n is an integer of 2 to 4; X represents a single bond or a bivalent organic group; A represents a (n+1) valent linking group; and Q included in multiple numbers each independently represents a group that includes an alkali-dissociable group.

The polymer of the embodiment of the present invention includes a group having the aforementioned specific structure that includes a plurality of alkali-dissociable groups. Therefore, the radiation sensitive resin composition that contains the polymer can improve affinity to a developer solution upon alkali development while securing the hydrophobicity during liquid immersion lithography, whereby inhibition of occurrence of development defects such as blob defects is enabled.

In the group represented by the above formula (1) included in the polymer of the embodiment of the present invention, it is preferred that A represents an alicyclic group having 4 to 20 carbon atoms or a chain hydrocarbon group having 1 to 20 carbon atoms. Due to the "A" being the group having a specific structure as described above, superior alkali dissociability of the alkali-dissociable group included in the group represented by the above formula (1) is attained. As a result, radiation sensitive resin composition that contains the polymer can further improve the affinity to a developer solution upon alkali development while securing the hydrophobicity during liquid immersion lithography, and occurrence of development defects such as blob defects can be further inhibited.

In the group represented by the above formula (1) included in the polymer of the embodiment of the present invention, it is preferred that Q represents a group represented by the following formula (2-1) or (2-2):

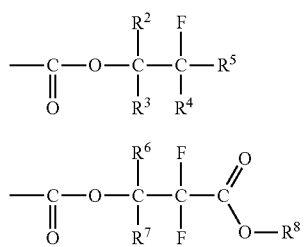

in the formula (2-1), $R^2$ and $R^3$ each independently represent a hydrogen atom or a hydrocarbon group having 1 to 10 carbon atoms; $R^4$ represents a hydrogen atom, a fluorine atom or a hydrocarbon group having 1 to 10 carbon atoms; $R^5$ represents a fluorine atom or a monovalent organic group, wherein a part or all of hydrogen atoms included in the hydrocarbon group of $R^2$, $R^3$ and $R^4$ and the monovalent organic group included in $R^5$ may be substituted, and in the formula (2-2), $R^6$ and $R^7$ each independently represent a hydrogen atom or a chain hydrocarbon group having 1 to 10 carbon atoms; and $R^8$ represents a monovalent organic group.

When "Q" in the above formula (1) is a group represented by the above formula (2-1) or (2-2), the radiation sensitive resin composition that contains the polymer can achieve both storage stability and high alkali dissociability. Therefore, the radiation sensitive resin composition that contains the polymer can further improve affinity to a developer solution upon alkali development while securing the hydrophobicity during liquid immersion lithography, and as a result, occurrence of development defects such as blob defects can be further inhibited.

The compound of an embodiment of the present invention is represented by the following formula (0):

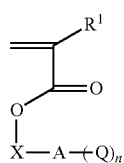

in the formula (0), n is an integer of 2 to 4; X represents a single bond or a bivalent organic group; A represents a (n+1) valent linking group; Q included in multiple numbers each independently represents a group that includes an alkali-dissociable group; and $R^1$ represents a hydrogen atom, a fluorine atom, a methyl group, or a trifluoromethyl group.

The compound of the embodiment of the present invention can be suitably used as a material of the polymer described above due to having the aforementioned specific structure.

"A" in the above formula (0) preferably represents an alicyclic group having 4 to 20 carbon atoms or a chain hydrocarbon group having 1 to 20 carbon atoms. Due to the "A" having the aforementioned specific structure, a higher alkali dissociability of the alkali-dissociable group included in the group represented by Q is attained. As a result, the radiation sensitive resin composition that contains the polymer synthesized using the compound as a material can further improve affinity to a developer solution upon alkali development while securing the hydrophobicity during liquid immersion lithography, whereby the occurrence of development defects such as blob defects can be further inhibited.

"Q" in the above formula (0) represents preferably a group represented by the following formula (2-1) or (2-2):

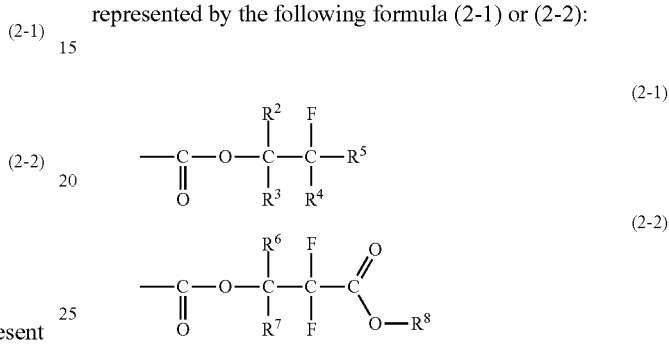

in the formula (2-1), $R^2$ and $R^3$ each independently represent a hydrogen atom or a hydrocarbon group having 1 to 10 carbon atoms; $R^4$ represents a hydrogen atom, a fluorine atom or a hydrocarbon group having 1 to 10 carbon atoms; $R^5$ represents a fluorine atom or a monovalent organic group, wherein a part or all of hydrogen atoms included in the hydrocarbon group of $R^2$, $R^3$ and $R^4$ and the monovalent organic group included in $R^5$ may be substituted, and in the formula (2-2), $R^6$ and $R^7$ each independently represent a hydrogen atom or a chain hydrocarbon group having 1 to 10 carbon atoms; and $R^8$ represents a monovalent organic group.

When "Q" in the above formula (0) is a group represented by the above formula (2-1) or (2-2), the radiation sensitive resin composition that contains the polymer synthesized using the compound as a material can achieve both storage stability and high alkali dissociability. Therefore, the radiation sensitive resin composition can further improve affinity to a developer solution upon alkali development while securing the hydrophobicity during liquid immersion lithography, and as a result, occurrence of development defects such as blob defects can be further inhibited.

Herein, the "radioactive ray" as referred to in connection with the "radiation sensitive resin composition", "radiation sensitive acid generator" and the like involves a category including visible light rays, ultraviolet rays, far ultraviolet rays, X-rays, charged particle rays and the like.

It is to be noted that the content of the structural unit in each polymer may be determined in terms of a mean value in each polymer based on an area ratio of a peak corresponding to each structural unit obtained on a $^{13}$C-NMR spectrum of each polymer.

The radiation sensitive resin composition of the embodiment of the present invention can form a resist film that has sufficient hydrophobicity during liquid immersion lithography, favorable affinity to a developer solution, and that is capable of inhibiting occurrence of development defects such as blob defects and bridge defects. Therefore, use of the radiation sensitive resin composition enables a fine pattern having an excellent shape to be formed.

The embodiments will now be described

<Radiation Sensitive Resin Composition>

The radiation sensitive resin composition of the embodiment of the present invention contains (A) a polymer and (B) an acid generator. In addition, the radiation sensitive resin composition may contain (C) a polymer as suitable optional component. Furthermore, other optional components may be contained as long as the effects of the invention are not impaired. Hereinafter, each of the components is explained in detail.

<(A) Polymer>

The polymer (A) includes the group represented by the above formula (1). Since the polymer (A) includes a group having the aforementioned specific structure, the radiation sensitive resin composition can improve affinity to a developer solution upon alkali development while sufficiently securing hydrophobicity during liquid immersion lithography. As a result, the radiation sensitive resin composition enables inhibition of occurrence of development defects such as blob defects, whereby formation of a pattern having a favorable shape is enabled. It is assumed that such effects can be achieved according to the following mechanism. The group represented by the above formula (1) has a plurality of alkali-dissociable groups. Therefore, the radiation sensitive resin composition exhibits hydrophobicity before the alkali development, whereby elution of substances can be favorably inhibited even if liquid immersion lithography is carried out, and a receding contact angle between the resist film and the liquid for liquid immersion can be sufficiently increased. Accordingly, effects of prohibiting remanence of water droplets after scanning exposure carried out at high speeds, and the like can be exerted. On the other hand, upon development, a plurality of the aforementioned alkali-dissociable groups dissociate by an alkaline developer to generate polar groups. Thus, it is believed that the radiation sensitive resin composition can improve affinity to a developer solution on the entirety of the resist film, whereby inhibition of occurrence of development defects such as blob defects is enabled.

In the formula (1), n is an integer of 2 to 4; X represents a single bond or a bivalent organic group; A represents a (n+1) valent linking group; and Q included in multiple numbers each independently represents a group that includes an alkali-dissociable group.

The bivalent organic group represented by X may be, for example, a chain hydrocarbon group having 1 to 20 carbon atoms, an alicyclic group having 3 to 20 carbon atoms, an aromatic group having 6 to 20 carbon atoms, and the like.

Examples of the chain hydrocarbon group having 1 to 20 carbon atoms include a methylene group, an ethylene group, a propylene group, a butylene group, a hexylene group, and the like. Of these, an ethylene group is preferred.

Examples of the alicyclic group having 3 to 20 carbon atoms include monocyclic alicyclic groups such as a cyclopropanediyl group, a cyclobutanediyl group, a cyclopentanediyl group, a cyclohexanediyl group, a cycloheptanediyl group, a cyclooctanediyl group, a cyclodecanediyl group, a cyclododecanediyl group, a cyclobutenediyl group, a cyclopentenediyl group, a cyclohexenediyl group, a cyclodecenediyl group, a cyclododecenediyl, cyclopentadienediyl group, a cyclohexadienediyl group and a cyclodecadienediyl group; and polycyclic alicyclic groups such as a bicyclo[2.2.1]heptenediyl group, a bicyclo[2.2.2]octanediyl group, a tricyclo[5.2.1.0$^{2,6}$]decanediyl group, a tricyclo[3.3.1.1$^{3,7}$]decanediyl group, a tetracyclo[6.2.1.1$^{3,6}$0$^{2,7}$]dodecanediyl group, an adamantanediyl group, a bicyclo[2.2.1]heptenediyl group, a bicyclo[2.2.2]octenediyl group, a tricyclo[5.2.1.0$^{2,6}$]decenediyl group, a tricyclo[3.3.1.1.$^{3,7}$]decenediyl group and a tetracyclo[6.2.1.1$^{3,6}$0$^{2,7}$]dodecenediyl group.

Examples of the aromatic group having 6 to 20 carbon atoms include a phenylene group, a naphthylene group, and the like.

The (n+1) valent linking group represented by A may be, for example, an alicyclic group having 3 to 30 carbon atoms, a chain hydrocarbon group having 1 to 30 carbon atoms, an aromatic group having 6 to 30 carbon atoms, and the like.

Examples of the alicyclic group having 3 to 30 carbon atoms include monocyclic alicyclic groups derived by removing (n+1) hydrogen atoms from cycloalkane and cycloalkene such as cyclopropane, cyclobutane, cyclobutene, cyclopentane, cyclopentene, cyclohexane, cyclooctane, cyclooctene, cyclodecane and cyclododecane; polycyclic alicyclic groups derived by removing (n+1) hydrogen atoms from bicycloheptane, bicyclooctane, tricyclodecane, tricyclodecane, tetracyclododecane, norbornane, adamantane, bicycloheptene, bicyclooctene, tricyclodecene, etc., and the like Examples of the chain hydrocarbon group having 1 to 30 carbon atoms include groups derived by removing (n+1) hydrogen atoms from alkane such as methane, ethane, propane, butane, pentane, hexane, octane, decane and dodecane, and the like.

Examples of the aromatic group having 6 to 30 carbon atoms include groups derived by removing (n+1) hydrogen atoms from a benzene ring, a naphthalene ring, a anthracene ring, etc., and the like.

A in the above formula (1) is preferably an alicyclic group having 4 to 20 carbon atoms or a chain hydrocarbon group having 1 to 20 carbon atoms. When A represents an alicyclic group having 4 to 20 carbon atoms or a chain hydrocarbon group having 1 to 20 carbon atoms, superior alkali dissociability of the alkali-dissociable group included in the group represented by the above formula (1) is attained, whereby the radiation sensitive resin composition can further improve the affinity to a developer solution upon alkali development while securing the hydrophobicity during liquid immersion lithography. As a result, occurrence of blob defects and bridge defects can be further inhibited. Of these, a norbornanetriyl group, an ethylene group, an ethanetriyl group, a propanetriyl group, and a propanetetrayl group are preferred.

The alkali-dissociable group in the group that includes an alkali-dissociable group represented by Q is not particularly limit as long as it is a group that is dissociated by an alkaline developer treatment in a development process when a resist pattern is formed using the radiation sensitive resin composition.

Q in the above formula (1) preferably represents a group represented by the above formula (2-1) or (2-2).

When the "Q" represents the group represented by the above formula (2-1), a carbon atom that directly binds to an oxygen atom of the ester group does not have a highly electron-attracting fluorine atom via a direct binding; therefore, the radiation sensitive resin composition is superior in storage stability, and due to the fluorine atom attached to a carbon atom adjacent to the carbon atom, $R^1$ itself serves as an alkali-dissociable group having high alkali dissociability. As a result, the radiation sensitive resin composition can achieve both storage stability and high alkali dissociability.

In addition, since the "Q" represents a group represented by the above formula (2-2), in other words, since the "Q" has a structure in which two fluorine atoms are attached to a carbon atom adjacent to the carbon atom of the ester group of Q, the $R^8$ serves as an alkali-dissociable group having high alkali dissociability.

Accordingly, it is believed that when Q represents an organic group represented by the above formula (2-1) or (2-2), the radiation sensitive resin composition can further improve the affinity to a developer solution upon alkali development while securing the hydrophobicity during liquid immersion lithography, whereby occurrence of development defects such as blob defects can be further inhibited.

In the formula (2-1), $R^2$ and $R^3$ each independently represent a hydrogen atom or a hydrocarbon group having 1 to 10 carbon atoms; $R^4$ represents a hydrogen atom, a fluorine atom or a hydrocarbon group having 1 to 10 carbon atoms; $R^5$ represents a fluorine atom or a monovalent organic group, wherein a part or all of hydrogen atoms included in the hydrocarbon group of $R^2$, $R^3$ and $R^4$ and the monovalent organic group included in $R^5$ may be substituted.

Examples of the hydrocarbon group having 1 to 10 carbon atoms represented by $R^2$ to $R^4$ include alkyl groups such as a methyl group, an ethyl group and a propyl group; cycloalkyl groups such as a cyclopropyl group and a cyclobutyl group; aryl groups such as a phenyl group and a naphthyl group, and the like. Among these, an ethyl group is preferred.

Examples of the monovalent organic group represented by $R^5$ include a chain hydrocarbon group, an alicyclic group, an aromatic group, an ester group, a group derived by combining these, and the like. It is to be noted that a part or all of hydrogen atoms included in the organic group may be substituted with a substituent such as a fluorine atom or a perfluoroalkyl group having 1 to 10 carbon atoms.

Examples of the chain hydrocarbon group include alkyl groups such as a methyl group, an ethyl group, a propyl group and a butyl group, and the like.

Examples of the alicyclic group include cycloalkyl groups such as a cyclopropyl group, a cyclobutyl group and a cyclohexyl group, and the like.

Examples of the aromatic group include aryl groups such as a phenyl group and a naphthyl group, and the like.

The $R^5$ is preferably a fluorine atom or a trifluoromethyl group.

In the formula (2-2), $R^6$ and $R^7$ each independently represent a hydrogen atom or a chain hydrocarbon group having 1 to 10 carbon atoms; and $R^8$ represents a monovalent organic group.

Examples of the chain hydrocarbon group having 1 to 10 carbon atoms represented by $R^6$ and $R^7$ include a methyl group, an ethyl group, a propyl group, a butyl group, a hexyl group, and the like. Of these, an ethyl group is preferred.

The monovalent organic group represented by $R^8$ is exemplified by groups similar to the aforementioned monovalent organic groups which may be represented by $R^5$.

Examples of the Q include groups represented by the following formulae (q-1) to (q-14), and the like.

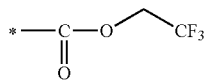

(q-1)

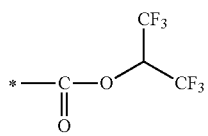

(q-2)

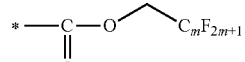

(q-3)

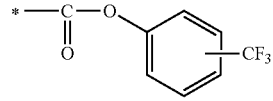

(q-4)

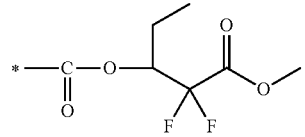

(q-5)

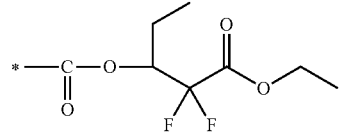

(q-6)

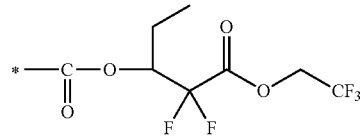

(q-7)

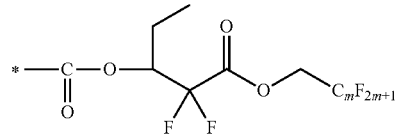

(q-8)

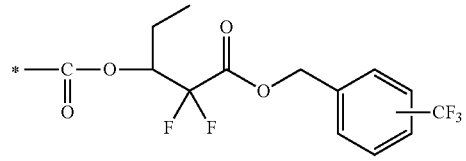

(q-9)

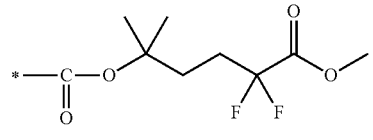

(q-10)

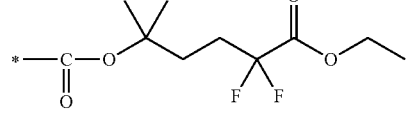

(q-11)

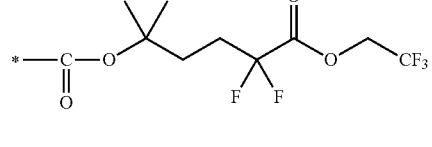

(q-12)

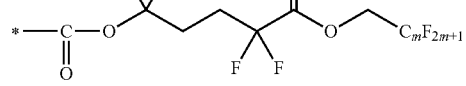

(q-13)

(q-14)

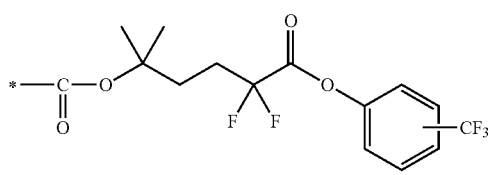

In the above formula (q-8) and (q-13), m is an integer of 1 to 10; and * indicates a site to be linked to A in the above formula (1).

Of these, groups represented by the above formulae (q-1) to (q-3) corresponding to groups represented by the above formula (2-1), and groups represented by the above formulae (q-5) to (q-9) corresponding to groups represented by the above formula (2-2).

The group represented by the above formula (1) is exemplified by groups represented by the following formulae, and the like.

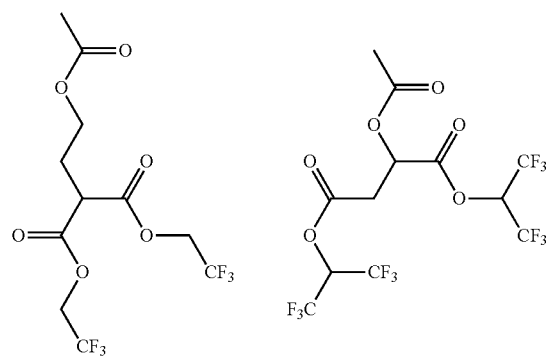

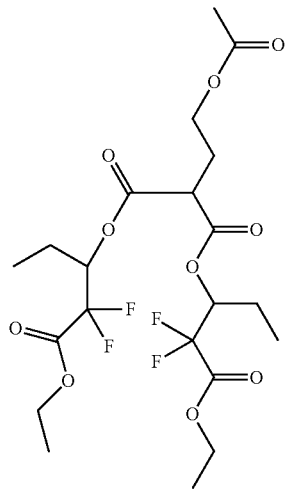

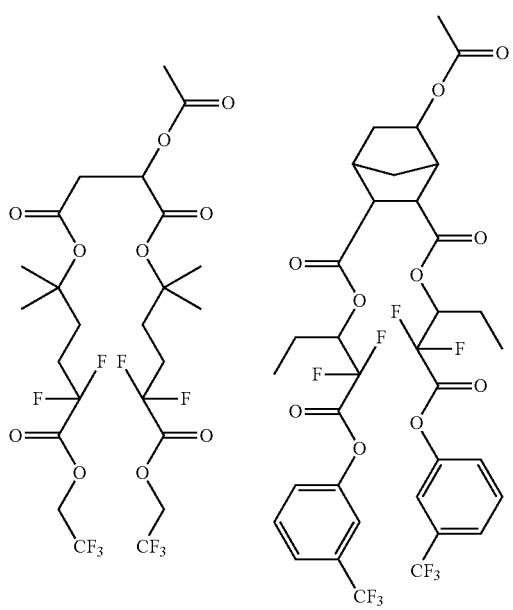

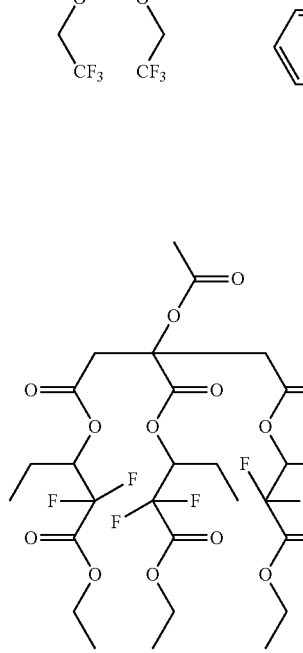

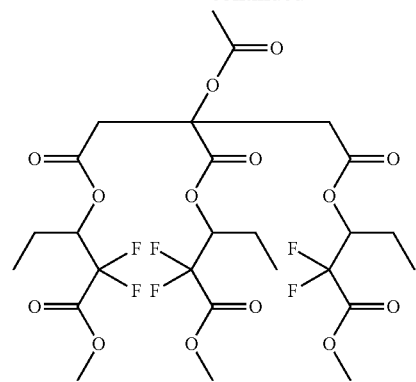
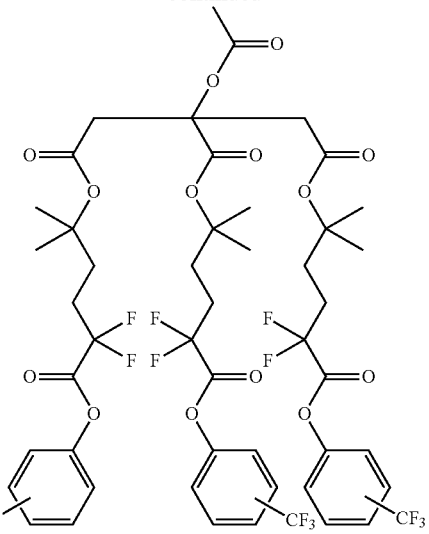
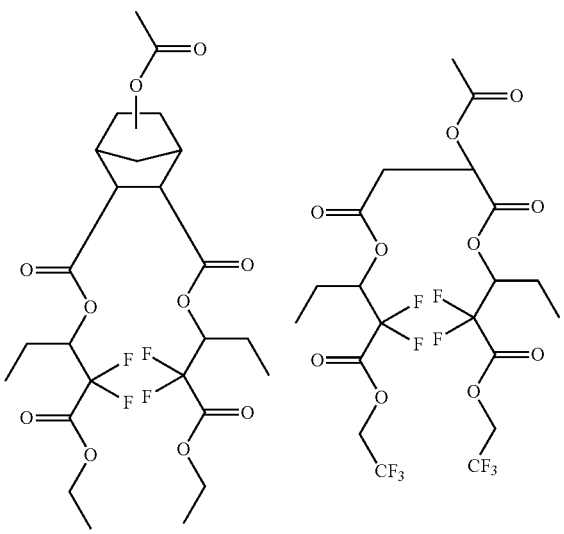
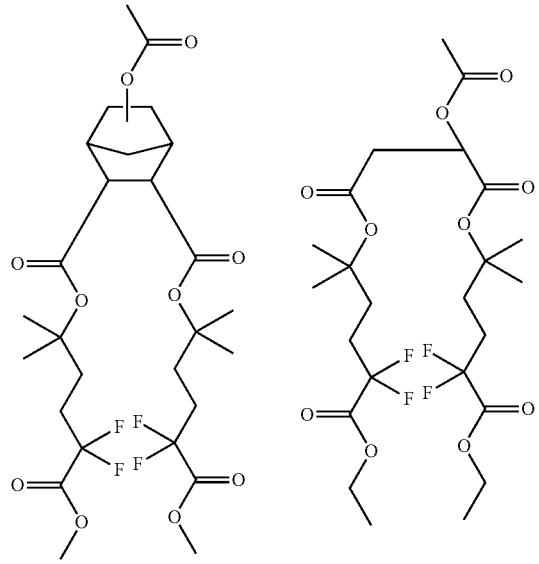
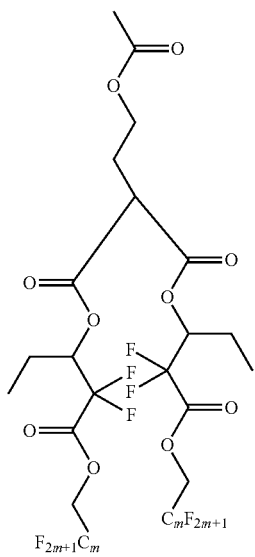
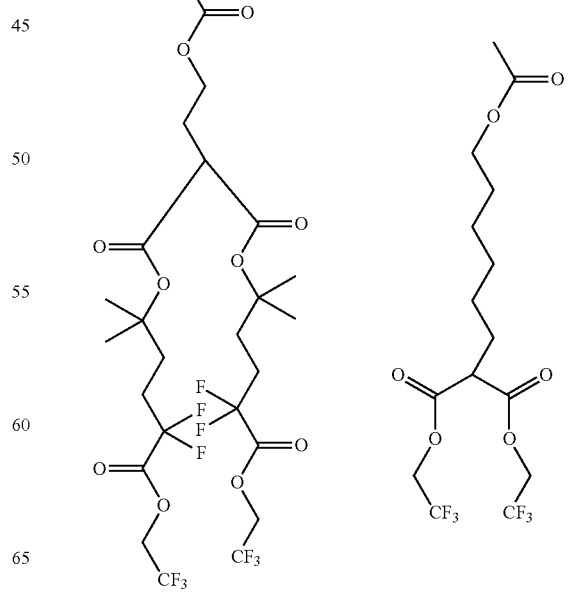

-continued

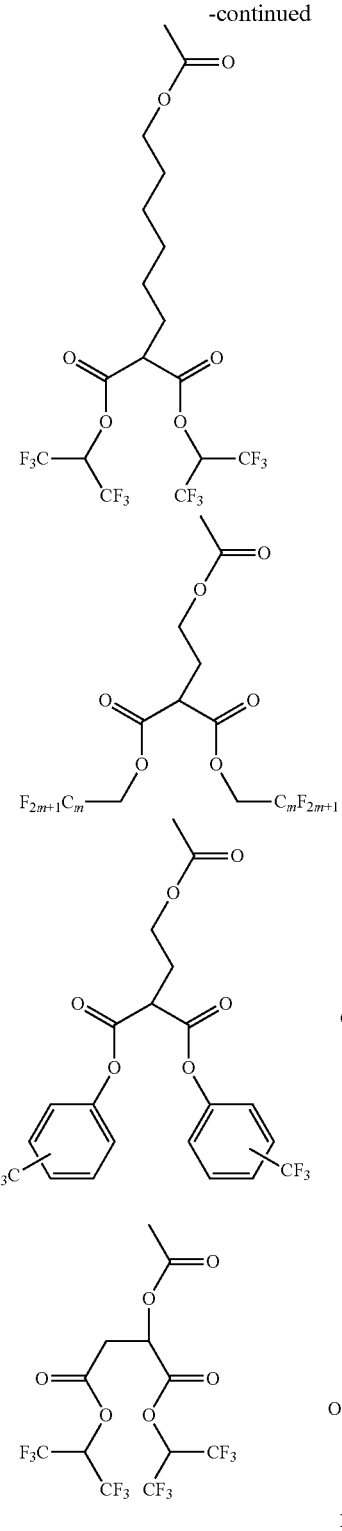

In the above formula, m is as defined in connection with the above formulae (q-8) and (q-13).

The group represented by the above formula (1) may be included in the polymer (A) in any form, but is preferably included in the structural unit constructing the polymer (A). More specifically, the polymer (A) preferably has a structure that includes the group represented by the above formula (1) (hereinafter, may be also referred to as "structural unit (I)"), and further may include other structural unit as long as the effects of the invention is not impaired. Each structural unit is explained in detail below.

[Structure Unit (I)]

Examples of the polymerizable group which may be included in the structural unit (I) include a (meth)acryloyl group, an alkenyl group, a cinnamoyl group, a cinnamylideneacetyl group, a benzalacetophenone group, a styryl pyridine group, an α-phenylmaleimide group, a phenylazido group, a sulfonylazido group, a carbonyl azido group, a diazo group, an o-quinonediazide group, a furylacryloyl group, a coumarin group, a pyrone group, an anthracene group, a benzophenone group, a stilbene group, a dithiocarbamate group, a xanthate group, a 1,2,3-thiadiazole group, a cyclopropene group, an azadioxabicyclo group, and the like. Of these, in light of polymerizability, a (meth)acryloyl group is preferred.

The structural unit (I) include represented by the following formula structural unit, and the like.

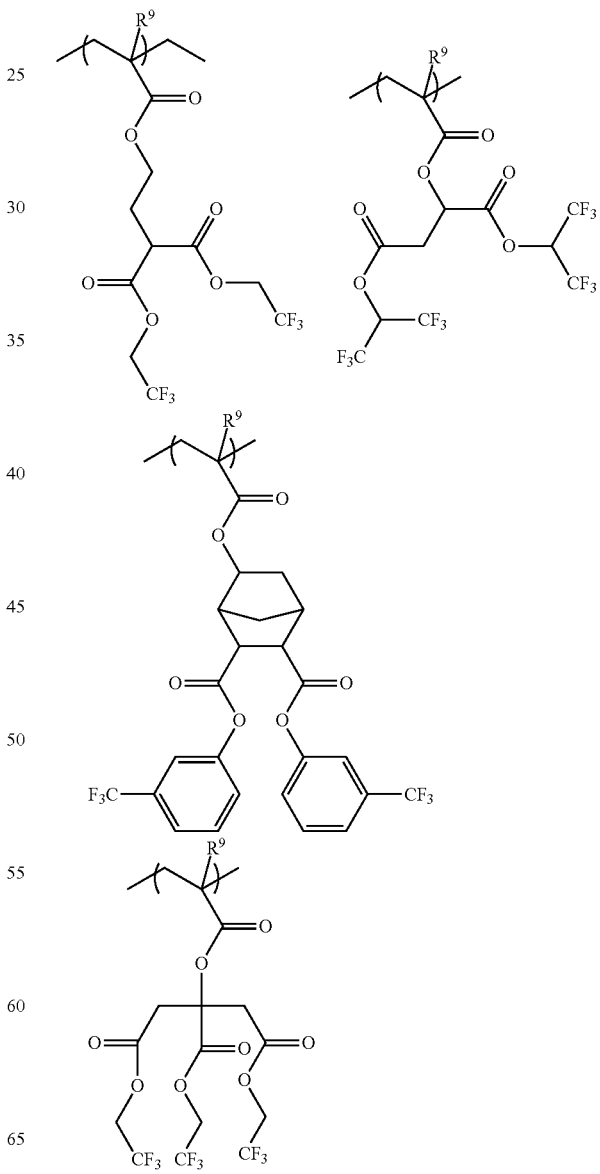

17
-continued
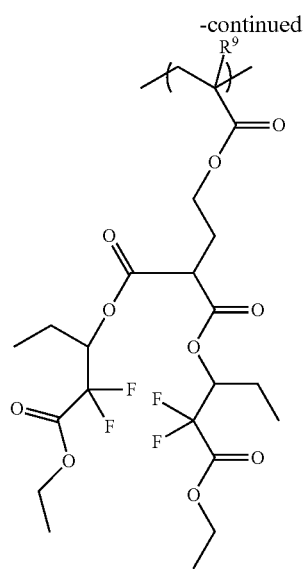
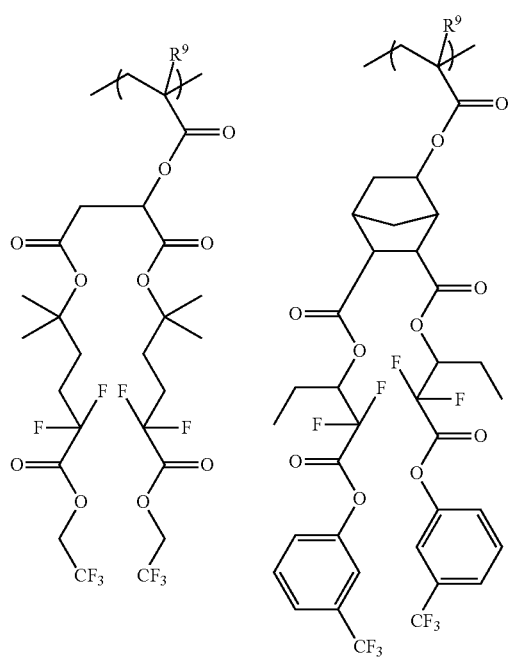
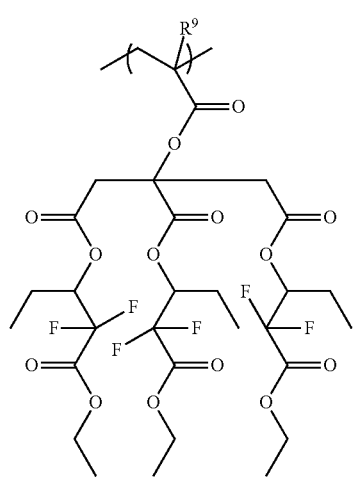
18
-continued
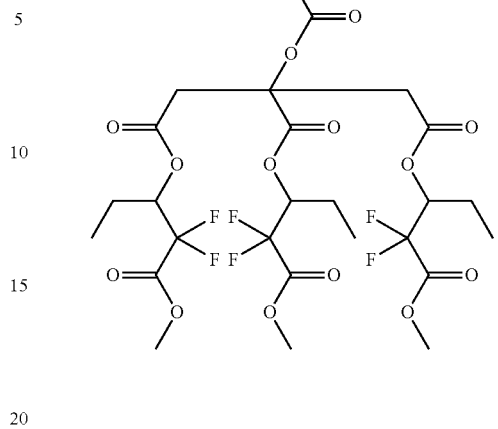
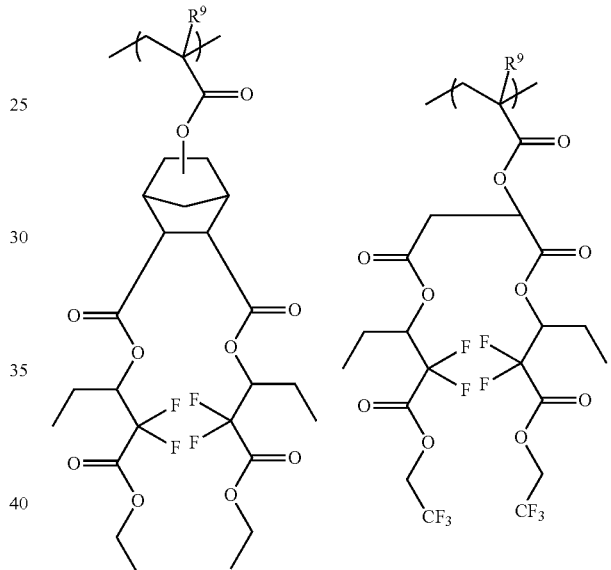
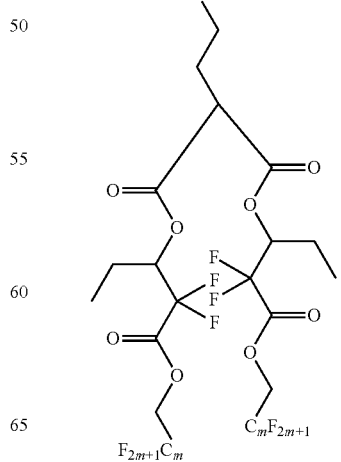

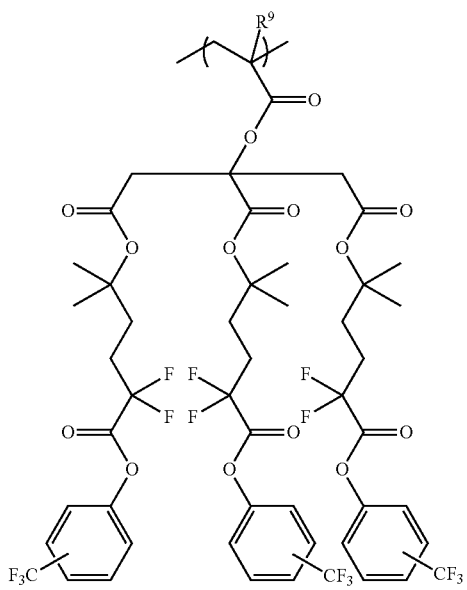
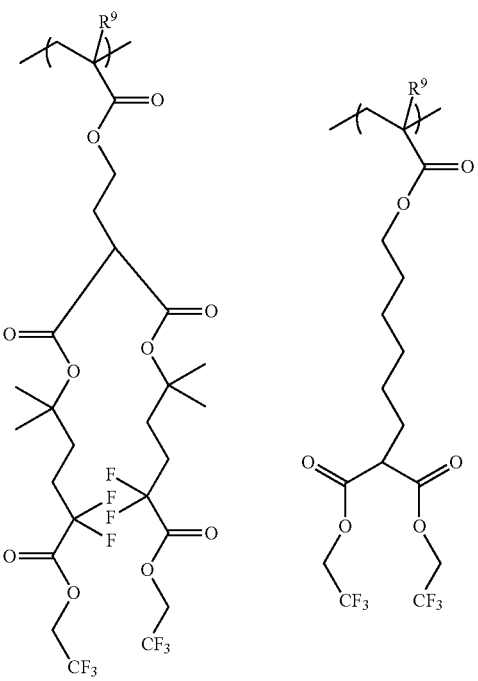
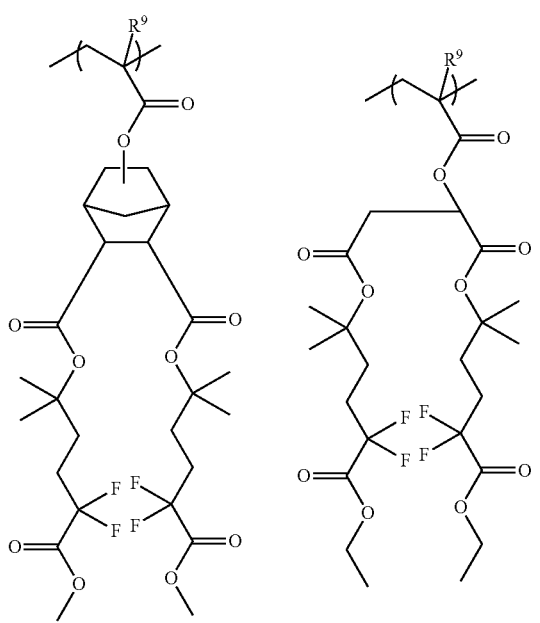
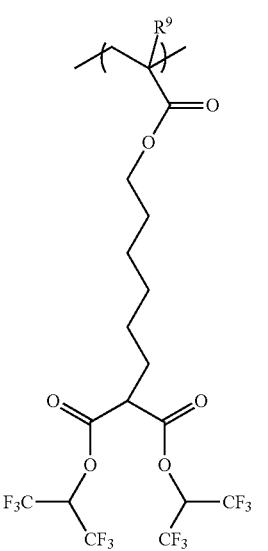
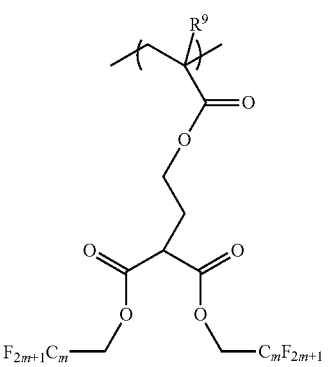

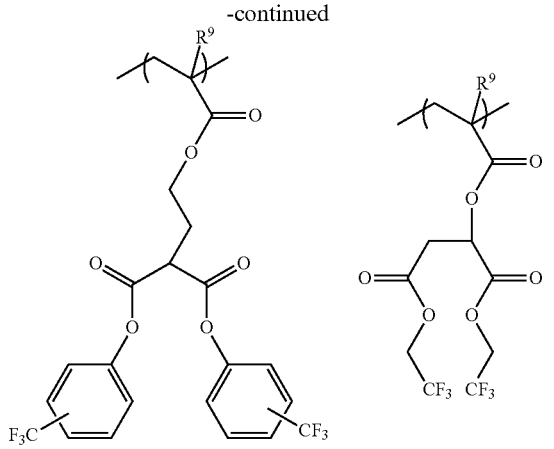

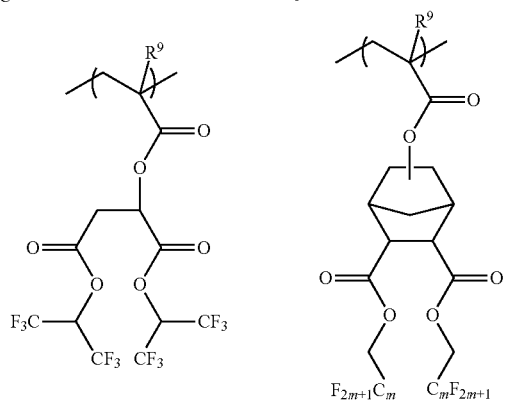

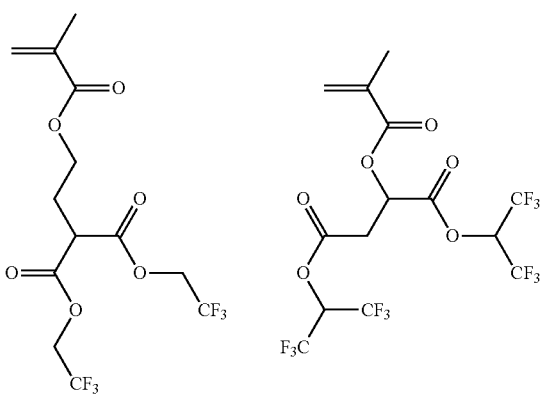

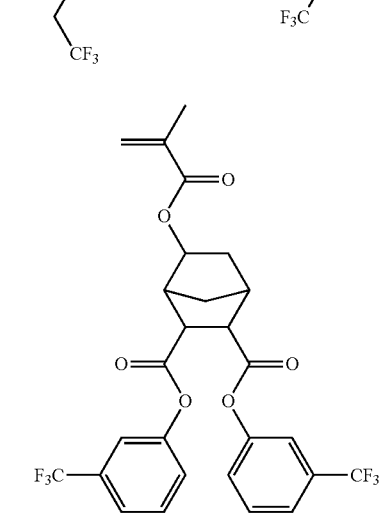

In the above formula, m is as defined in connection with the above formula (q-8) and (q-13); and R⁹ represents a hydrogen atom, a fluorine atom, a methyl group or a trifluoromethyl group.

In the polymer (A), the content of the structural unit (I) is preferably no less than 5 mol %, more preferably no less than 20 mol %, and still more preferably no less than 40 mol % with respect to the entire structural units that constitute the polymer (A). It is to be noted that the polymer (A) may include one, or at least two types of the structural unit (I).

Examples of the monomer that gives the structural unit (I) include the compounds represented by the above formula (0), and the like.

In the above formula (0), n is an integer of 2 to 4; X represents a single bond or a bivalent organic group; A represents a (n+1) valent linking group; Q included in multiple numbers each independently represents a group that includes an alkali-dissociable group; and R¹ represents a hydrogen atom, a fluorine atom, a methyl group, or a trifluoromethyl group.

Details of X, A and Q in the above formula (0) are as defined in connection with X, A and Q in the above formula (1), respectively.

Examples of the compound represented by the above formula (0) include those represented by the following formulae, and the like.

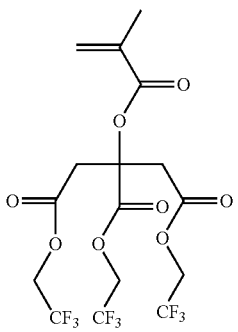

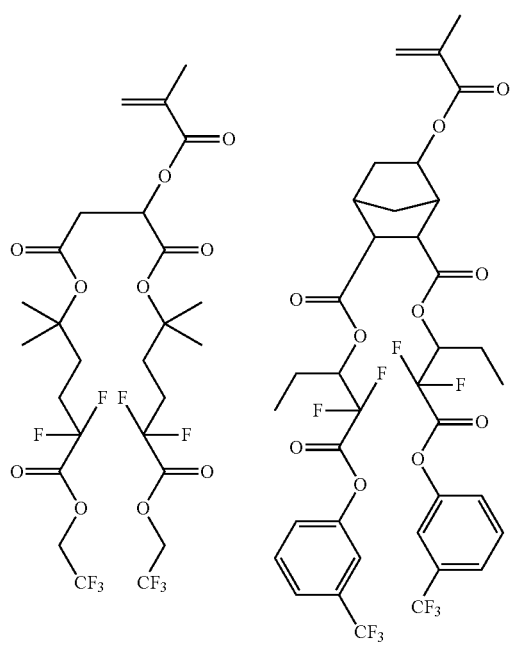
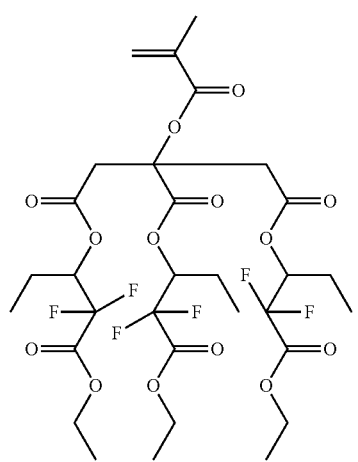
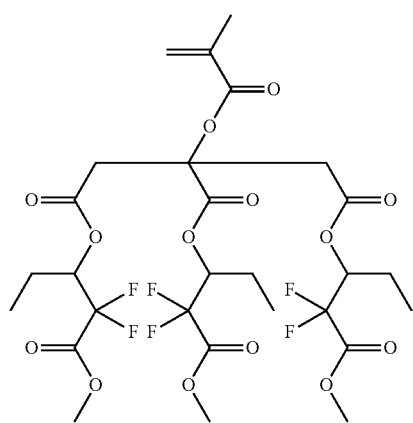
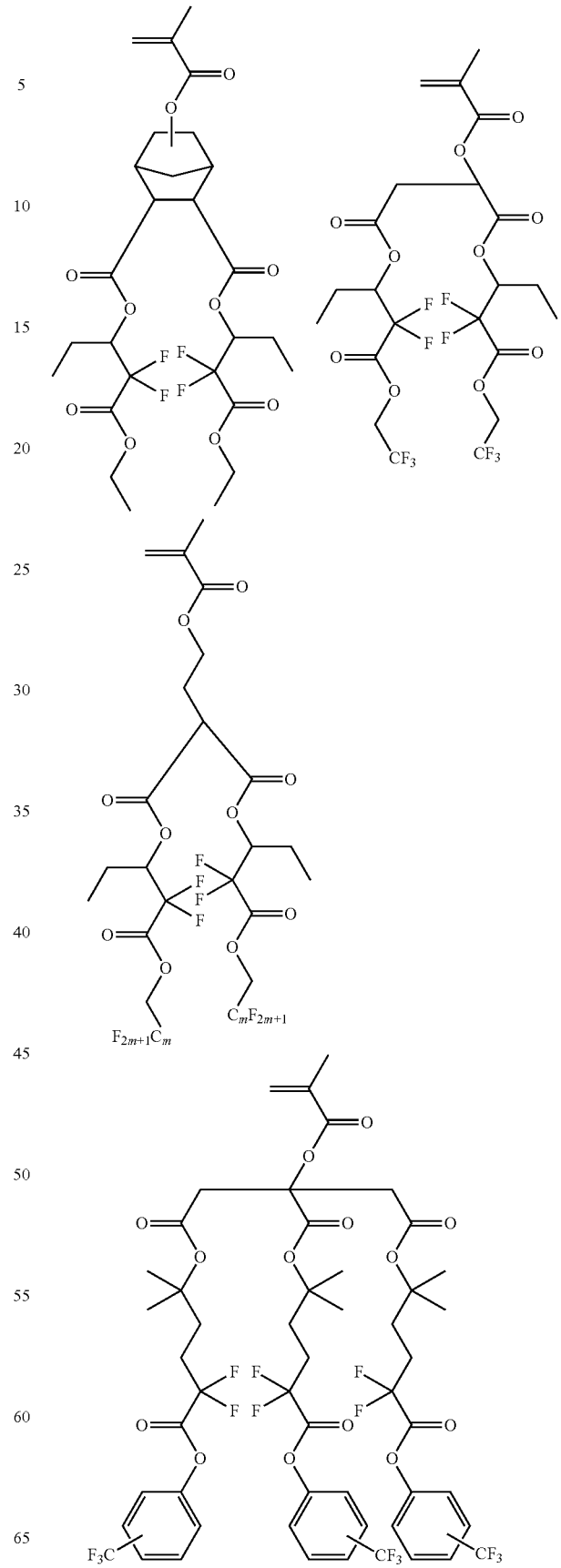

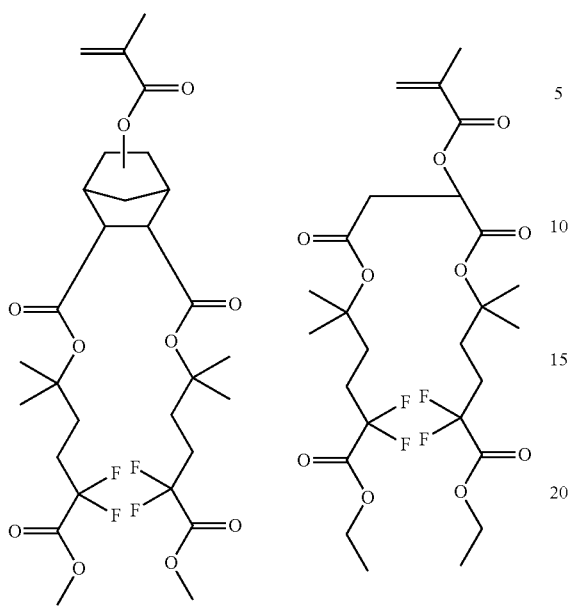
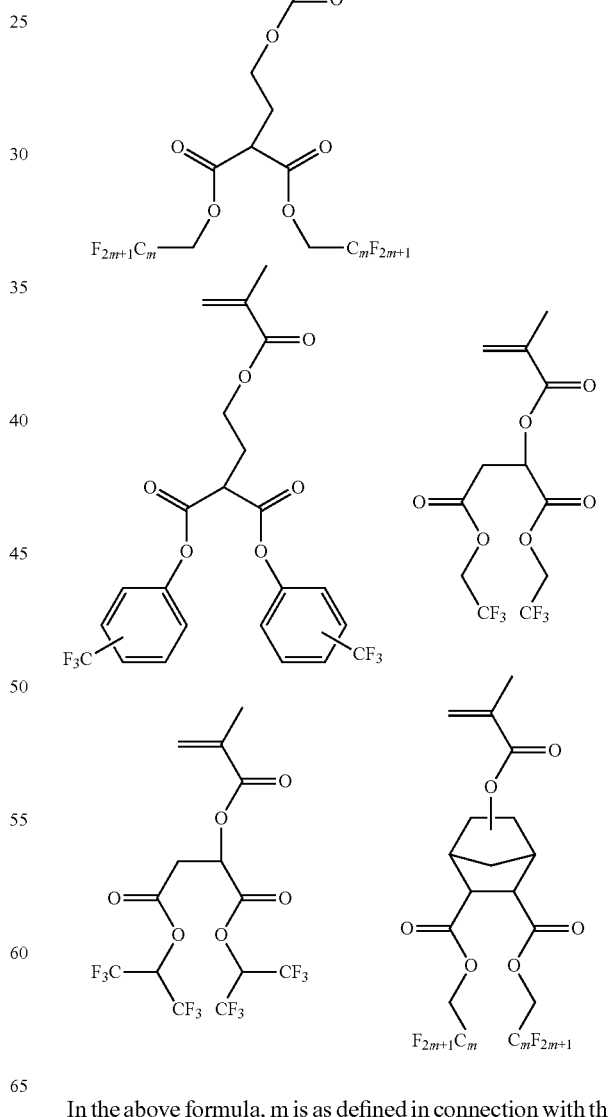
In the above formula, m is as defined in connection with the above formula ($r^1$-8) and ($r^1$-13).

A method for synthesizing the compound represented by the above formula (0) is exemplified by a method as described below, and the like. More specifically, when Q in the above formula (0) is to be the group represented by the above formula (2-1) or (2-2), the compound represented by the above formula (0) can be synthesized by: allowing a compound represented by the following formula (0-a) to react with an acid chloride such as oxalyl chloride to chlorinate carboxyl groups included in the compound represented by the following formula (0-a); and allowing the product to react with a compound represented by the following formula (0-b) or a compound represented by the following formula (0-c) in the presence of a halogenating agent and an acid scavenger such as amine.

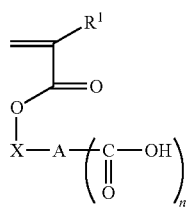
(0-a)

In the above formula (0-a), n is an integer of 2 to 4; X represents a single bond or a bivalent organic group; A represents a (n+1) valent linking group; and $R^1$ represents a hydrogen atom, a fluorine atom, a methyl group, or a trifluoromethyl group.

(0-b)

HO—C(R²)(R³)—C(F)(R⁴)—R⁵

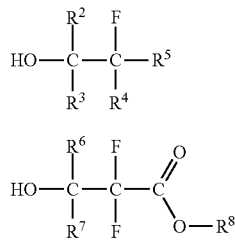
(0-c)

In the above formula (0-b), $R^2$ to $R^5$ are as defined in connection with the above formula (2-1). In the above formula (0-c), $R^6$ to $R^8$ are as defined in connection with the above formula (2-2).

Examples of the solvent used in the reaction include ketones such as acetone, 2-butanone, 4-methyl-2-pentanone and 2-heptanone; saturated carboxylate esters such as ethyl acetate, n-butyl acetate, i-butyl acetate and methyl propionate; alkanes such as n-pentane, n-hexane, n-heptane, n-octane, n-nonane and n-decane; cycloalkanes such as cyclohexane, cycloheptane, cyclooctane, decalin and norbornane; aromatic hydrocarbons such as benzene, toluene, xylene, ethylbenzene and cumene; halogenated hydrocarbons such as chlorobutanes, bromohexanes, dichloroethanes, hexamethylene dibromide and chlorobenzene; ethers such as tetrahydrofuran, dioxane, dimethoxy ethanes and diethoxyethanes, and the like. Of these, ketones and ethers are preferred, and ethers are more preferred. These solvents may be used either alone, or in combination of at least two types thereof.

The reaction temperature in these methods may be appropriately predetermined depending on the halogenating agent and/or the base catalyst, and is usually 25° C. to 180° C., preferably 25° C. to 160° C., and more preferably 25° C. to 140° C. Further, the reaction time may vary depending on the conditions such as the reaction temperature, the type of the base catalyst and the monomer subjected to the reaction, and is usually 30 min to 8 hrs, preferably 45 min to 6 hrs, and more preferably 1 hour to 5 hrs. Further, the total reaction time period including time period for dropwise addition may also vary depending on the conditions similarly to the time period for the dropwise addition, and is usually 30 min to 20 hrs, preferably 45 min to 16 hrs, and more preferably 1 hour to 14 hrs The halogenating agent is exemplified by oxalyl chloride and thionyl chloride. The base catalyst is exemplified by triethylamine, pyridine, N,N-dimethyl-4-aminopyridine and N,N-dicyclohexylcarbodiimide. The acid scavenger is exemplified by trialkylamine such as triethylamine, trimethylamine and tripropylamine, pyridine, and the like.

The polymer (A) may include other structural unit in addition to the structural unit (I), as long as the effects of the invention are not impaired. The other structural unit is exemplified by a structural unit having an acid-dissociable group (hereinafter, may be also referred to as "structural unit (II)"), a structural unit having a polar group (hereinafter, may be also referred to as "structural unit (III)"), a structural unit having a lactone structure, a sultone structure or a cyclic carbonate structure (hereinafter, may be also referred to as "structural unit (IV)"), and other structural unit having a fluorine atom, and the like. Hereinafter, each structural unit is explained in detail.

[Structure Unit (II)]

The structural unit (II) is different from the structural unit (I) and has an acid-dissociable group. The structural unit (II) is exemplified by a structural unit represented by the following formula (3), and the like. When the polymer (A) further has the structural unit (II), radiosensitivity of the radiation sensitive resin composition can be improved.

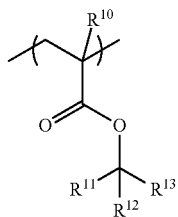
(3)

In the above formula (3), $R^{10}$ represents a hydrogen atom or a methyl group; and $R^{11}$ to $R^{13}$ each independently represent an alkyl group having 1 to 4 carbon atoms or an alicyclic hydrocarbon group having 4 to 20 carbon atoms, wherein $R^{12}$ and $R^{13}$ may bind with each other to form a bivalent alicyclic hydrocarbon group having 4 to 20 carbon atoms together with the carbon atom to which they are attached.

The alkyl group having 1 to 4 carbon atoms is exemplified by a methyl group, an ethyl group, a n-propyl group, an i-propyl group, a n-butyl group, a 2-methylpropyl group, a 1-methylpropyl group, a t-butyl group, and the like.

The alicyclic hydrocarbon group having 4 to 20 carbon atoms, or the alicyclic hydrocarbon group having 4 to 20 carbon atoms formed by binding of $R^{12}$ and $R^{13}$ with each other together with the carbon atom to which they are attached is exemplified by a polycyclic alicyclic group having a bridged skeleton such as an adamantane skeleton or a norbornane skeleton; a monocyclic alicyclic group having a cycloalkane skeleton such as cyclopentane or cyclohexane. In addition, these groups may be substituted with, for example, at least one or more types of linear, branched or cyclic alkyl groups having 1 to 10 carbon atoms.

The structural unit (II) is preferably a structural unit represented by the following formulae.
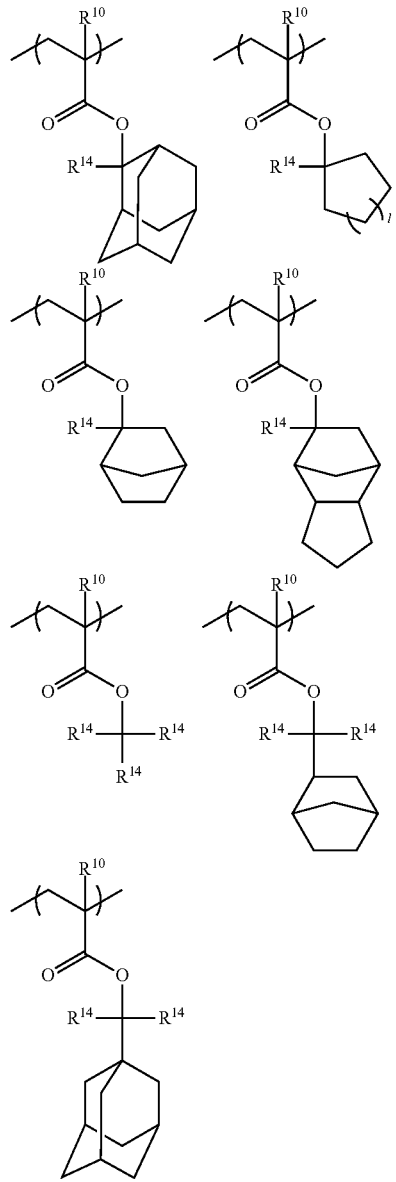
In the above formula, $R^{10}$ is as defined in connection with the above formula (3); $R^{14}$ represents an alkyl group having 1 to 4 carbon atoms; and l is an integer of 1 to 6.
Of these, structural units represented by the following formula (2-1) to (2-20) are more preferred.
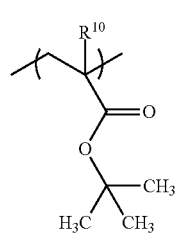
(2-1)
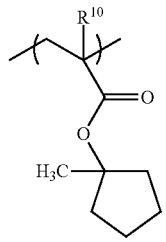
(2-2)
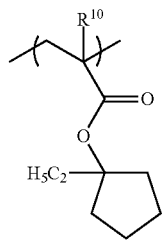
(2-3)
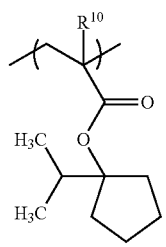
(2-4)
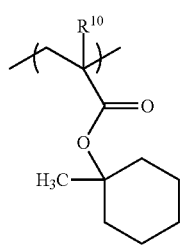
(2-5)
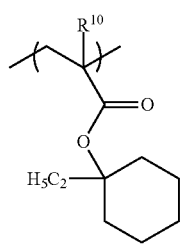
(2-6)
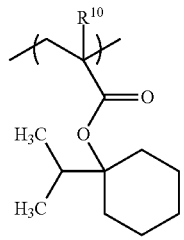
(2-7)

(2-8) 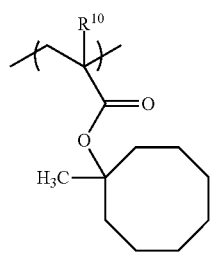
(2-9) 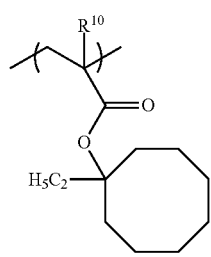
(2-10) 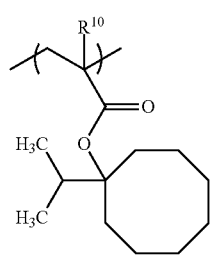
(2-11) 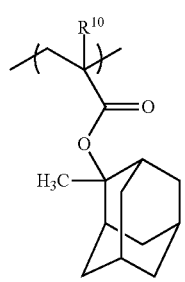
(2-12) 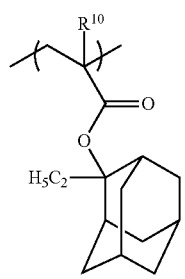
(2-13) 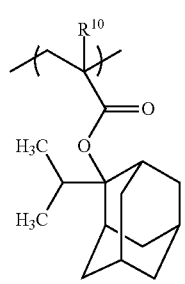
(2-14) 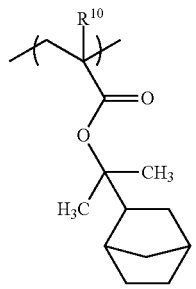
(2-15) 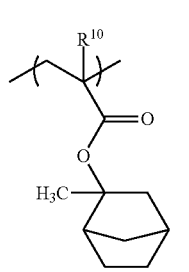
(2-16) 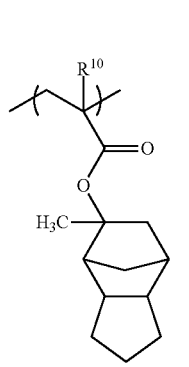
(2-17) 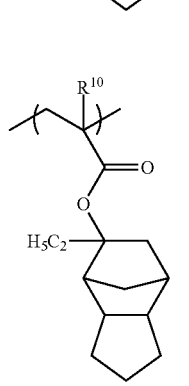
(2-18) 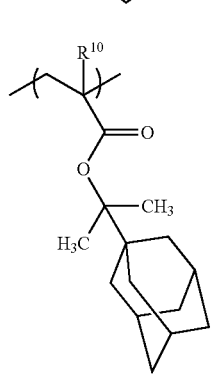

(2-19)

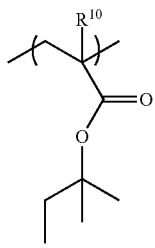

(2-20)

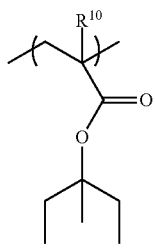

In the above formula, $R^{10}$ is as defined in connection with the above formula (3).

Of these, structural units represented by the above formulae (2-2), (2-3), (2-6) are more preferred.

In the polymer (A), the content of the structural unit (II) is preferably 5 mol % to 80 mol %, more preferably 10 mol % to 80 mol %, and still more preferably 20 mol % to 60 mol %, with respect to the entire structural units that constitute the polymer (A). When the content of the structural unit (II) is greater than 80 mol %, the adhesiveness of the resist film may be deteriorated, and thus pattern collapse and pattern peeling may ne caused. Also, when the content is less than 5 mol %, sensitivity of the resist film may be insufficient. It is to be noted that the polymer (A) may include one, or at least two types of the structural unit (II).

Examples of the monomer that gives the structural unit (II) include (meth)acrylic acid-bicyclo[2.2.1]hept-2-yl ester, (meth)acrylic acid-bicyclo[2.2.2]octa-2-yl ester, (meth)acrylic acid-tricyclo[5.2.1.0$^{2,6}$]deca-7-yl ester, (meth)acrylic acid-tricyclo[3.3.1.1$^{3,7}$]deca-1-yl ester, (meth)acrylic acid-tricyclo[3.3.1.1$^{3,7}$]deca-2-yl ester, and the like.

[Structure Unit (III)]

It is preferred that the polymer (A) further includes a structural unit (III) having a polar group. The "polar group" as referred to herein involves a hydroxyl group, a carboxyl group, keto group, a sulfoneamide group, an amino group, an amide group, a cyano group, and the like. Due to including the structural unit (III), the polymer (A) can improve compatibility with other components such as the acid generator (B).

Examples of the structural unit (III) include those represented by the following formulae, and the like.

(3-1)

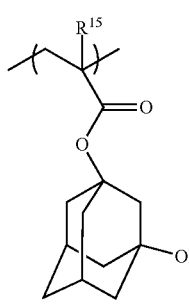

(3-2)

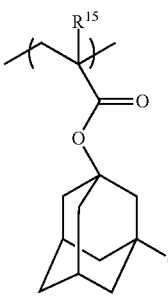

(3-3)

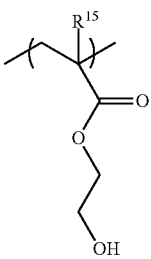

(3-4)

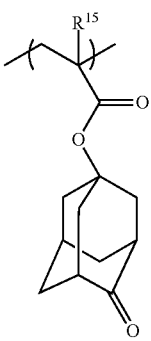

(3-5)

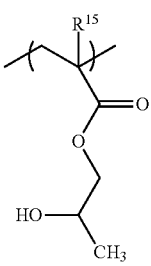

(3-6)

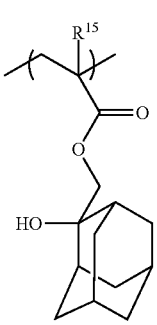

(3-7)
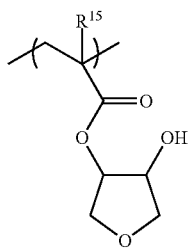

(3-8)
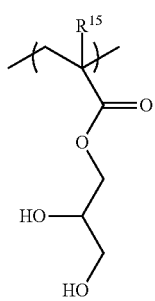

(3-9)
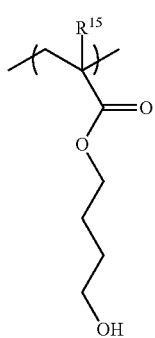

(3-10)
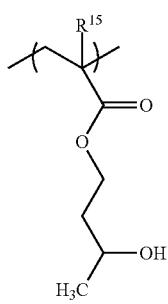

(3-11)
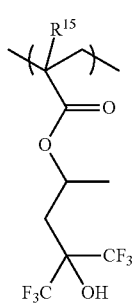

(3-12)
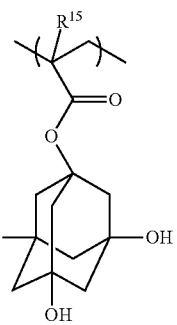

(3-13)
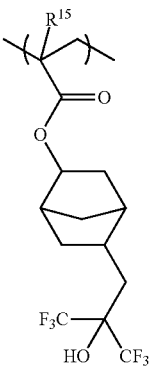

(3-14)
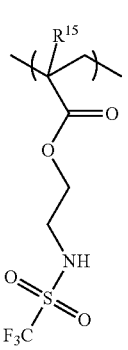

(3-15)
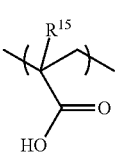

In the above formula, $R^{15}$ represents a hydrogen atom, a fluorine atom, a methyl group or a trifluoromethyl group.

Of these, the structural units represented by the above formula (3-3) are preferred.

In the polymer (A), the content of the structural unit (III) is preferably no less than 5 mol % and no greater than 80 mol %, and more preferably no less than 8 mol % and no greater than 40 mol % with respect to the entire structural units that constitute the polymer (A). It is to be noted that the polymer (A) may include one, or at least two types of the structural unit (III).

[Structure Unit (IV)]

The polymer (A) may further include a structural unit (IV) having a lactone structure, a sultone structure or a cyclic carbonate structure. Due to including the structural unit (IV), adhesiveness of the resist film to the substrate can be improved.

Examples of the structural unit (IV) include those represented by the following formulae, and the like.

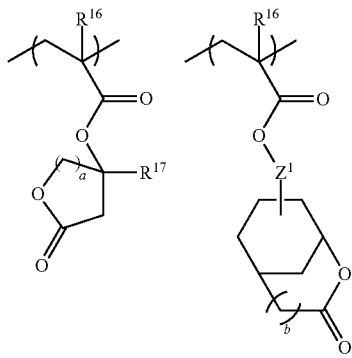
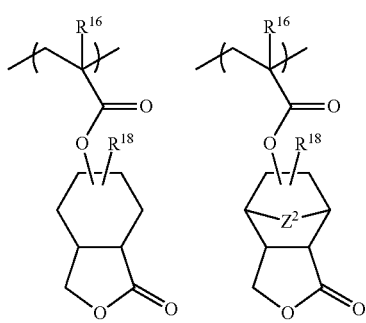
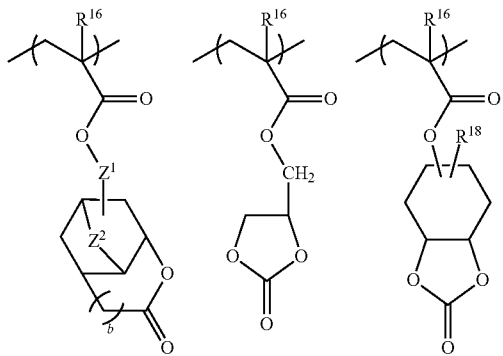
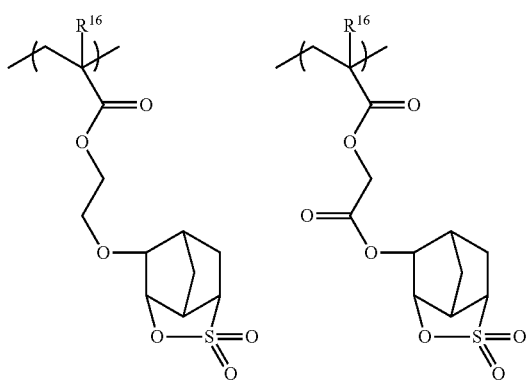
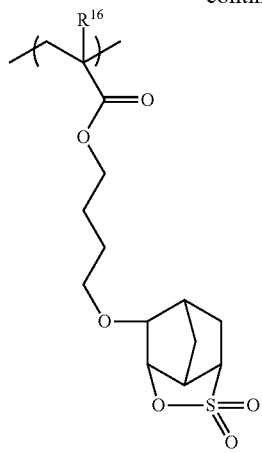
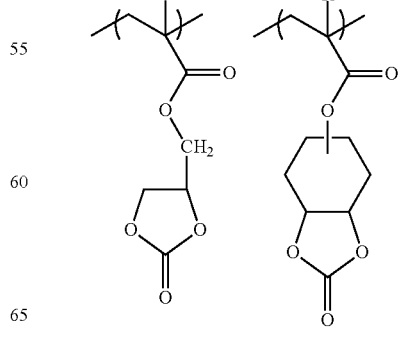

In the above formula, $R^{16}$ represents a hydrogen atom, a fluorine atom, a methyl group or a trifluoromethyl group; $R^{17}$ represents a hydrogen atom or a methyl group; $R^{18}$ represents a hydrogen atom or a methoxy group; $Z^1$ represents a single bond or a methylene group; $Z^2$ represents a methylene group or an oxygen atom; and a and b are each independently 0 or 1.

The structural unit (IV) is preferably a structural unit represented by the following formulae.

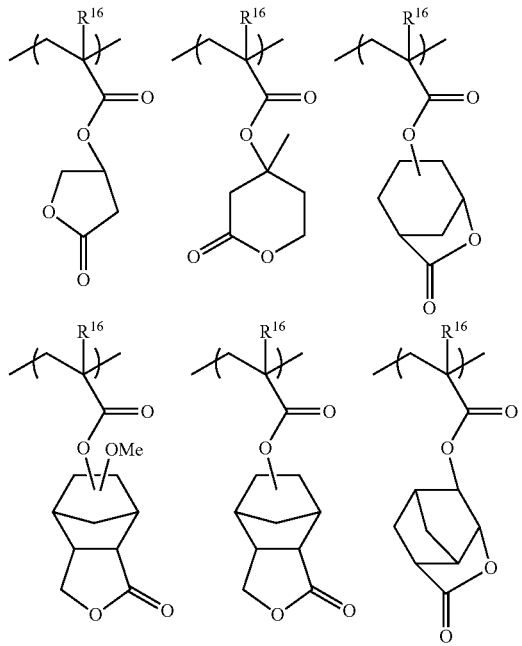

In the above formula, $R^{16}$ represents a hydrogen atom or a methyl group.

In the polymer (A), the content of the structural unit (IV) is preferably no less than 0 mol % and no greater than 70 mol %, and more preferably no less than 10 mol % and no greater than 40 mol % with respect to the entire structural units that constitute the polymer (A). When the content falls within such a range, adhesiveness between the resist and the substrate can be improved. On the other hand, when the content is greater than 70 mol %, favorable pattern may not be obtained.

Examples of preferable monomer that gives the structural unit (IV) include monomers disclosed in PCT International Publication No. 2007/116664, and the like.

<Other Structure Unit Having Fluorine Atoms>

The polymer (A) may include as the structural unit having fluorine atoms in addition to the structural unit (I), a structural unit (V) represented by the following formula (4), a structural unit (VI) represented by the following formula (5) described later, and the like. Due to the polymer (A) including the other structural unit having fluorine atoms, hydrophobicity during liquid immersion lithography can be improved. It is to be noted that the content of fluorine atoms in the polymer (A) is usually no less than 5% by mass, preferably 5% by mass to 50% by mass, and more preferably 5% by mass to 45% by mass with respect to 100% by mass of the entirety of the polymer (A). It is to be noted that the content of fluorine atoms may be determined by $^{13}$C-NMR.

[Structure Unit (V)]

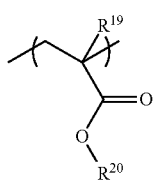

(4)

In the above formula (4), $R^{19}$ represents a hydrogen atom, a fluorine atom, a methyl group or a trifluoromethyl group; $R^{20}$ represents a linear or branched alkyl group having 1 to 6 carbon atoms and having fluorine atoms, or a monovalent alicyclic hydrocarbon group having 4 to 20 carbon atom and having fluorine atoms, wherein a part or all of hydrogen atoms of the alkyl group and alicyclic hydrocarbon group may be substituted.

Examples of the linear or branched alkyl group having 1 to 6 carbon atoms include a methyl group, an ethyl group, a propyl group, a butyl group, and the like.

Examples of the monovalent alicyclic hydrocarbon group having 4 to 20 carbon atom include a cyclopentyl group, a cyclopentyl propyl group, a cyclohexyl group, a cyclohexylmethyl group, a cycloheptyl group, a cyclooctyl group, a cyclooctylmethyl group, and the like.

Of the structural units (V) represented by the above formula (4), for example, structural units represented by the following formulae (4-1) and (4-2) are preferred.

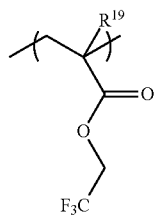

(4-1)

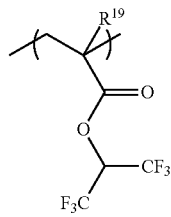

(4-2)

In the formulae (4-1) and (4-2), $R^{19}$ is as defined in connection with the above formula (4).

Examples of the monomer that gives the structural unit (V) include trifluoromethyl(meth)acrylate, 2,2,2-trifluoroethyl (meth)acrylate, perfluoroethyl(meth)acrylate, perfluoro n-propyl(meth)acrylate, perfluoro i-propyl(meth)acrylate, perfluoro n-butyl(meth)acrylate, perfluoro i-butyl(meth) acrylate, perfluoro t-butyl(meth)acrylate, perfluorocyclohexyl(meth)acrylate, 2-(1,1,1,3,3,3-hexafluoro)propyl (meth)acrylate, 1-(2,2,3,3,4,4,5,5-octafluoro)pentyl(meth) acrylate, 1-(2,2,3,3,4,4,5,5-octafluoro)hexyl(meth)acrylate, perfluorocyclohexylmethyl(meth)acrylate, 1-(2,2,3,3,3-pentafluoro)propyl(meth)acrylate, 1-(2,2,3,3,4,4,4-heptafluoro) penta(meth)acrylate, 1-(3,3,4,4,5,5,6,6,7,7,8,8,9,9,10,10,10-heptadecafluoro)decyl(meth)acrylate, 1-(5-trifluoromethyl-3,3,4,4,5,6,6,6-octafluoro)hexyl(meth)acrylate, and the like.

In the polymer (A), the content of the structural unit (V) is preferably no less than 0 mol % and no greater than 70 mol %, and more preferably no less than 5 mol % and no greater than 30 mol % with respect to the entire structural units that constitute the polymer (A). It is to be noted that the polymer (A) may include one, or at least two types of the structural unit (V).

[Structure Unit (VI)]

The structural unit (VI) is represented by the following formula (5).

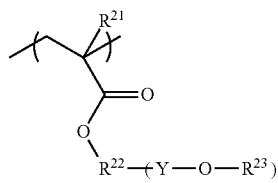

(5)

In the formula (5), $R^{21}$ represents a hydrogen atom, a methyl group or a trifluoromethyl group; $R^{22}$ represents a (k+1) valent linking group; Y represents a bivalent linking group having fluorine atoms; $R^{23}$ represents a hydrogen atom or a monovalent organic group; k is an integer of 1 to 3, wherein provided that k is 2 or 3, X and $R^{23}$ included in multiple numbers may be each the same or different.

In the above formula (5), examples of the (k+1) valent linking group represented by $R^{22}$ include linear or branched hydrocarbon groups having 1 to 30 carbon atoms, alicyclic hydrocarbon groups having 3 to 30 carbon atoms, aromatic hydrocarbon groups having 6 to 30 carbon atoms, and groups derived by combining any of these groups with at least one selected from the set consisting of an oxygen atom, a sulfur atom, an ether group, an ester group, a carbonyl group, an imino group and an amide group. In addition, the (k+1) valent linking group may have a substituent.

Examples of the linear or branched hydrocarbon group having 1 to 30 carbon atoms include groups derived by eliminating (k+1) hydrogen atoms from a hydrocarbon group such as methane, ethane, propane, butane, pentane, hexane, heptane, decane, icosane or triacontane.

Examples of the alicyclic hydrocarbon group having 3 to 30 carbon atoms include:

monocyclic saturated hydrocarbons such as cyclopropane, cyclobutane, cyclopentane, cyclohexane, cycloheptane, cyclooctane, cyclodecane, methylcyclohexane and ethylcyclohexane;

monocyclic unsaturated hydrocarbons such as cyclobutene, cyclopentene, cyclohexene, cycloheptene, cyclooctene, cyclodecene, cyclopentadiene, cyclohexadiene, cyclooctadiene and cyclodecadiene;

polycyclic saturated hydrocarbons such as bicyclo[2.2.1]heptane, bicyclo[2.2.2]octane, tricyclo[5.2.1.0$^{2,6}$]decane, tricyclo[3.3.1.1$^{3,7}$]decane, tetracyclo[6.2.1.1$^{3,6}$0$^{2,7}$]dodecane and adamantane; and groups derived by eliminating (k+1) hydrogen atoms from a polycyclic hydrocarbon group such as bicyclo[2.2.1]heptene, bicyclo[2.2.2]octene, tricyclo[5.2.1.0$^{2,6}$]decene, tricyclo[3.3.1.1$^{3,7}$]decene and tetracyclo[6.2.1.1$^{3,6}$0$^{2,7}$]dodecene.

Examples of the aromatic hydrocarbon group having 6 to 30 carbon atoms include groups derived by eliminating (k+1) hydrogen atoms from an aromatic hydrocarbon group such as benzene, naphthalene, phenanthrene, anthracene, tetracene, pentacene, pyrene, picene, toluene, xylene, ethylbenzene, mesitylene or cumene.

In the above formula (5), examples of the bivalent linking group having fluorine atoms represented by Y include bivalent linear hydrocarbon groups having 1 to 20 carbon atoms and having fluorine atoms; and Y includes a structure represented by the following formulae (Y-1) to (Y-6), or the like.

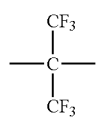

(Y-1)

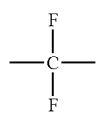

(Y-2)

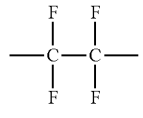

(Y-3)

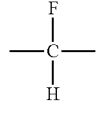

(Y-4)

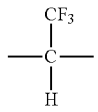

(Y-5)

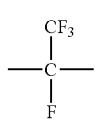

(Y-6)

Y preferably has a structure represented by the above formulae (Y-1) and (Y-2).

In the above formula (5), examples of the organic group represented by $R^{23}$ include linear or branched hydrocarbon groups having 1 to 30 carbon atoms, alicyclic hydrocarbon groups having 3 to 30 carbon atoms, aromatic hydrocarbon groups having 6 to 30 carbon atoms, and groups derived by combining any of these groups with at least one group selected from the set consisting of an oxygen atom, a sulfur atom, an ether group, an ester group, a carbonyl group, an imino group and an amide group.

Examples of the structural unit (VI) include those represented by the following formulae (5-1) and (5-2), and the like.

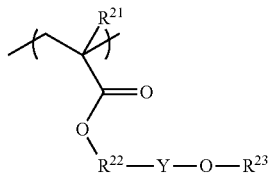

(5-1)

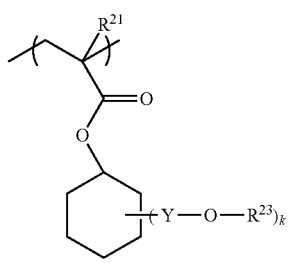

(5-2)

In the above formula (5-1), $R^{22}$ represents a bivalent linear, branched or cyclic saturated or unsaturated hydrocarbon group having 1 to 20 carbon atoms; $R^{21}$, Y and $R^{23}$ are as defined in connection with the above formula (5).

In the above formula (5-2), $R^{21}$, Y, $R^{23}$ and k are as defined in connection with the above formula (5), wherein provided that k is 2 or 3, Y and $R^{23}$ included in multiple numbers may be each the same or different.

Examples of the structural unit represented by the above formula (5-1) and formula (5-2) include those represented by the following formula (5-1-1), formula (5-1-2) and formula (5-2-1), and the like.

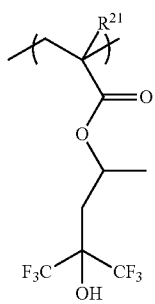

(5-1-1)

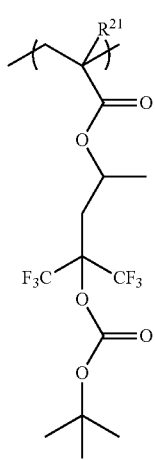

(5-1-2)

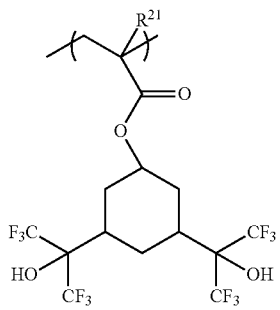

(5-2-1)

In the above formula (5-1-1), (5-1-2) and (5-2-1), $R^{21}$ is as defined in connection with the above formula (5).

Examples of monomers that give the structural unit (VI) include (meth)acrylic acid (1,1,1-trifluoro-2-trifluoromethyl-2-hydroxy-3-propyl)ester, (meth)acrylic acid (1,1,1-trifluoro-2-trifluoromethyl-2-hydroxy-4-butyl)ester, (meth)acrylic acid (1,1,1-trifluoro-2-trifluoromethyl-2-hydroxy-5-pentyl)ester, (meth)acrylic acid (1,1,1-trifluoro-2-trifluoromethyl-2-hydroxy-4-pentyl)ester, (meth)acrylic acid 2-{[5-(1',1',1'-trifluoro-2'-trifluoromethyl-2'-hydroxy)propyl]bicyclo[2.2.1]heptyl}ester, and the like.

In the polymer (A), the content of the structural unit (VI) is preferably no less than 0 mol % and no greater than 30 mol %, and more preferably no less than 5 mol % and no greater than 20 mol % with respect to the entire structural units that constitute the polymer (A). It is to be noted that the polymer (A) may include one, or at least two types of the structural unit (VI).

In the polymer (A), the content of the structural unit(s) other than the structural unit (I) is usually no greater than 50 mol %, and preferably no greater than 40 mol % with respect to the entire structural units that constitute the polymer (A).

The amount of the polymer (A) blended is preferably 0.1 parts by mass to 20 parts by mass, more preferably 1 part by mass to 15 parts by mass, and particularly preferably 2 parts by mass to 10 parts by mass with respect to 100 parts by mass of the polymer (C) described later. When the amount of the polymer (A) is less than 0.1 parts by mass, the effects achievable by containing the polymer (A) may not be sufficient. On the other hand, when the amount is greater than 20 parts by mass, water repellency of the surface of the resist can be so significant that development failure may occur.

<Method for Synthesizing the Polymer (A)>

The polymer (A) may be synthesized according to a common procedure such as radical polymerization. The polymer (A) is preferably synthesized according to a method such as, e.g.:

a method in which a solution containing a monomer and a radical initiator is added dropwise to a solution containing a reaction solvent or a monomer to permit a polymerization reaction;

a method in which a solution containing a monomer, and a solution containing a radical initiator are each separately added dropwise to a solution containing a reaction solvent or a monomer to permit a polymerization reaction; or a method in which a plurality of solutions each containing a monomer, and a solution containing a radical initiator are each separately added dropwise to a solution containing a reaction solvent or a monomer to permit a polymerization reaction.

It is to be noted that when the reaction is allowed by adding a monomer solution dropwise to a monomer solution, the amount of the monomer in the monomer solution added is preferably no less than 30 mol %, more preferably no less than 50 mol %, and particularly preferably no less than 70 mol % with respect to the total amount of the monomers used in the polymerization.

The reaction temperature in these methods may be determined ad libitum depending of the type of the initiator species. The reaction temperature is usually 30° C. to 180° C., preferably 40° C. to 160° C., and more preferably 50° C. to 140° C. Time period for the dropwise addition may vary depending on the conditions such as the reaction temperature, the type of the initiator and the monomer to be reacted, but is usually 30 min to 8 hrs, preferably 45 min to 6 hrs, and more preferably hour to 5 hrs. Further, the total reaction time period including time period for dropwise addition may also vary depending on the conditions similarly to the time period for the dropwise addition, and is usually 30 min to 8 hrs, preferably 45 min to 7 hrs, and more preferably 1 hour to 6 hrs.

The radical initiator for use in the polymerization is exemplified by azobisisobutyronitrile (AIBN), 2,2'-azobis(4-methoxy-2,4-dimethylvaleronitrile), 2,2'-azobis(2-cyclopropyl propionitrile), 2,2'-azobis(2,4-dimethylvaleronitrile), and the like. These initiators may be used either alone, or as a mixture of two or more thereof.

Examples of the solvent which may be used in polymerization include alcohols such as methanol, ethanol, 1-propanol, 2-propanol and 4-methyl-2-pentanol; ketones such as acetone, 2-butanone, 4-methyl-2-pentanone and 2-heptanone; saturated carboxylate esters such as ethyl acetate, n-butyl acetate, i-butyl acetate and methyl propionate; alkanes such as n-pentane, n-hexane, n-heptane, n-octane, n-nonane and n-decane; cycloalkanes such as cyclohexane, cycloheptane, cyclooctane, decalin and norbornane; aromatic hydrocarbons such as benzene, toluene, xylene, ethylbenzene and cumene; halogenated hydrocarbons such as chlorobutanes, bromohexanes, dichloroethanes, hexamethylene dibromide and chlorobenzene; ethers such as tetrahydrofuran, dimethoxyethanes and diethoxyethanes, and the like. These solvent may be used either alone, or in combination of at least two types thereof.

The resin obtained by the polymerization reaction may be recovered preferably by a reprecipitation technique. More specifically, after the polymerization reaction is completed, the polymerization mixture is charged into a solvent for reprecipitation, whereby a target resin is recovered in the form of powder. As the reprecipitation solvent, an alcohol, an alkanes or the like may be used either alone or as a mixture of two or more thereof. Alternatively to the reprecipitation technique, liquid separating operation, column operation, ultrafiltration operation or the like may be employed to recover the resin through eliminating low molecular components such as monomers and oligomers.

Although the polystyrene equivalent weight average molecular weight (Mw) of the polymer (A) as determined by gel permeation chromatography (GPC) is not particularly limited, is preferably no less than 1,000 and no greater than 150,000, more preferably no less than 2,000 and no greater than 100,000, and still more preferably no less than 3,000 and no greater than 50,000. It is to be noted that when the Mw of the polymer (A) is less than 1,000, heat resistance of the resulting resist is likely to be inferior. On the other hand, when the Mw of the polymer (A) exceeds 150,000, developability of the resulting resist is likely to be inferior.

In addition, a ratio (Mw/Mn) of the Mw to the polystyrene equivalent number average molecular weight (Mn) as determined by GPC of the polymer (A) is usually 1 or greater and 5 or less, preferably 1 or greater and 3 or less, and more preferably 1 or greater and 2 or less. When the ratio Mw/Mn falls within such a range, the photoresist film becomes superior in resolving ability.

The Mw and Mn as referred to herein means a value determined by GPC using GPC columns (Tosoh Corporation, G2000HXL×2, G3000HXL×1, G4000HXL×1), under analysis conditions involving a flow rate of 1.0 mL/min, an elution solvent of tetrahydrofuran and a column temperature of 40° C. using mono-dispersed polystyrene as a standard.

<(B) Acid Generator>

The acid generator (B) generated an acid upon exposure, whereby the acid allows the acid-dissociable group present in the polymer (A) and the polymer (C) described later to be dissociated. As a result, the polymer (A) and the polymer (C) become soluble in the developer solution. The form of the acid generator (B) contained in the radiation sensitive resin composition may be in the form of either a compound as described later (hereinafter, may be also referred to as appropriately "(B) acid generating agent") or a form incorporated as a part of the polymer, or may be in both of there forms.

Examples of the (B) acid generating agent include onium salt compounds, sulfonimide compounds, halogen-containing compound, diazoketone compounds, and the like. Among these (B) acid generating agents, onium salt compounds are preferred.

Examples of the onium salt compound include sulfonium salts (including tetrahydrothiophenium salts), iodonium salts, phosphonium salts, diazonium salts, pyridinium salts, and the like.

Examples of the sulfonium salt include triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-bicyclo[2.2.1]hept-2-yl-1,1,2,2-tetrafluoroethanesulfonate, 4-methanesulfonylphenyldiphenylsulfonium trifluoromethanesulfonate, 4-methanesulfonylphenyldiphenylsulfonium nonafluoro-n-butanesulfonate, 4-methane sulfonylphenyldiphenylsulfonium perfluoro-n-octanesulfonate, 4-methanesulfonylphenyldiphenylsulfonium 2-bicyclo[2.2.1]hept-2-yl-1,1,2,2-tetrafluoroethanesulfonate, triphenylphosphonium 1,1,2,2-tetrafluoro-6-(1-adamantanecarbonyloxy)-hexane-1-sulfonate, and the like. Of these, triphenylsulfonium trifluoromethanesulfonate, triphenylsulfonium nonafluoro-n-butanesulfonate, triphenylphosphonium 1,1,2,2-tetrafluoro-6-(1-adamantanecarbonyloxy)-hexane-1-sulfonate, and 4-cyclohexylphenyldiphenylsulfonium nonafluoro-n-butanesulfonate are preferred.

Examples of the tetrahydrothiophenium salt include 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl) tetrahydrothiophenium 2-bicyclo[2.2.1]hept-2-yl-1,1,2,2-tetrafluoroethanesulfonate, 1-(6-n-butoxynaphthalen-2-yl) tetrahydrothiophenium trifluoromethanesulfonate, 1-(6-n-butoxynaphthalen-2-yl)tetrahydrothiophenium nonafluoro-n-butanesulfonate, 1-(6-n-butoxynaphthalen-2-yl) tetrahydrothiophenium perfluoro-n-octanesulfonate, 1-(6-n-butoxynaphthalen-2-yl)tetrahydrothiophenium 2-bicyclo [2.2.1]hept-2-yl-1,1,2,2-tetrafluoroethanesulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium 2-bicyclo[2.2.1]hept-2-yl-1,1,2,2-tetrafluoroethanesulfonate, and the like. Of these tetrahydrothiophenium salts, 1-(4-n-butoxynaphthalen-1-yl) tetrahydrothiophenium nonafluoro-n-butanesulfonate, 1-(4-n-butoxynaphthalen-1-yl)tetrahydrothiophenium perfluoro-n-octanesulfonate and 1-(3,5-dimethyl-4-hydroxyphenyl) tetrahydrothiophenium nonafluoro-n-butanesulfonate are preferred.

Examples of the iodonium salt include diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hept-2-yl-1,1, 2,2-tetrafluoroethanesulfonate, bis(4-t-butylphenyl) iodonium trifluoromethanesulfonate, bis(4-t-butylphenyl) iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, and the like. Of these iodonium salts, bis(4-t-butylphenyl)iodonium nonafluoro-n-butanesulfonate is preferred.

Examples of the sulfonimide compound include N-(trifluoromethanesulfonyloxy)bicyclo[2.2.1]hept-5-ene-2,3-dicarboxyimide, N-(nonafluoro-n-butanesulfonyloxy)bicyclo [2.2.1]hept-5-ene-2,3-dicarboxyimide, N-(perfluoro-n-octanesulfonyloxy)bicyclo[2.2.1]hept-5-ene-2,3-dicarboxyimide, N-(2-bicyclo[2.2.1]hept-2-yl-1,1,2,2-tetrafluoroethanesulfonyloxy)bicyclo[2.2.1]hept-5-ene-2,3-dicarboxyimide, and the like. Of these sulfonimide compounds, N-(trifluoromethanesulfonyloxy)bicyclo[2.2.1] hept-5-ene-2,3-dicarboxyimide is preferred.

These acid generating agents (B) may be used either alone, or in combination of at least two types thereof. In the case in which the acid generator (B) is the acid generating agent (B), the amount thereof used is, in light of securement of the sensitivity and developability as a resist, usually no less than 0.1 parts by mass and no greater than 20 parts by mass, preferably no less than 0.5 parts by mass and no greater than 15 parts by mass with respect to 100 parts by mass of the polymer (C) described later. In this case, when the amount of the acid generating agent (B) used is less than 0.1 parts by mass, the sensitivity and the developability are likely to be inferior, whereas when the amount exceeds 15 parts by mass, transparency for radioactive rays is lowered, whereby it may be difficult to obtain a desired resist pattern.

<(C) Polymer>

The radiation sensitive resin composition suitably contains (C) a polymer in addition to the polymer (A) and (B) the acid generator, as a polymer. Due to the polymer (C) contained in the radiation sensitive resin composition, radiosensitivity of the resulting resist film can be improved.

The polymer (C) includes a structural unit having an acid-dissociable group. In addition, a structural unit having a polar group, and/or a structural unit having a lactone structure, a cyclic carbonate structure or a sultone structure, etc. may be included. The structural unit having an acid-dissociable group is exemplified by the structural unit similar to the structural unit (II) of the polymer (A). The structural unit having a polar group is exemplified by the structural unit similar to the structural unit (III) of the polymer (A). The structural unit having a lactone structure, a cyclic carbonate structure or a sultone structure is exemplified by the structural unit similar to the structural unit (IV) of the polymer (A).

The content of the structural unit having an acid-dissociable group in the polymer (C) is preferably no less than 20 mol % and no greater than 60 mol % with respect to the total amount of the entire structural units constructing the polymer (C). It is to be noted that the polymer (C) may include one, or at least two types of the structural unit having an acid-dissociable group.

The content of the structural unit having a lactone structure, a cyclic carbonate structure or a sultone structure in the polymer (C) is preferably no less than 30 mol % and no greater than 60 mol % with respect to the total amount of the entire structural units constructing the polymer (C). It is to be noted that the polymer (C) may include one, or at least two types of the structural unit having a lactone structure, a cyclic carbonate structure or a sultone structure.

The content of the structural unit having a polar group in the polymer (C) is preferably no less than 5 mol % and no greater than 50 mol % with respect to the total amount of the entire structural units constructing the polymer (C). It is to be noted that the polymer (C) may include one, or at least two types of the structural unit having a polar group.

Also, the polymer (C) preferably has a content of fluorine atoms lower than the content of the polymer (A). In the case in which such a polymer (C) is further contained, the extent of uneven distribution of the polymer (A) on the surface of the resist film increases when a resist film is formed from a composition containing the polymer (A) and the polymer (C). As a result, the aforementioned hydrophobicity and characteristics of the polymer (A) that result from its decrease can be more efficiently exhibited. It is to be noted that the content of the fluorine atoms may be determined by $^{13}$C-NMR.

<Method for Synthesizing the Polymer (C)>

The polymer (C) may be produced by polymerizing, for example, a monomer that corresponds to a predetermined each structural unit in an appropriate solvent using a radical polymerization initiator.

Examples of the solvent used for the polymerization include the solvents similar to those exemplified in connection with the method for synthesizing the polymer (A).

The reaction temperature in the polymerization is usually 40° C. to 150° C., and preferably 50° C. to 120° C. The reaction time period is usually 1 hour to 48 hrs, and preferably 1 hour to 24 hrs.

The Mw of the polymer (C) as determined by a GPC technique is preferably 1,000 to 100,000, more preferably 1,000 to 50,000, and particularly preferably 1,000 to 30,000. When the Mw of the polymer (C) falls within the above range, solubility in a solvent for resist sufficient for use as a resist can be provided, thereby enabling the effects of the the embodiment of invention to be improved.

The ratio (Mw/Mn) of the Mw to the Mn of the polymer (C) is usually 1 to 3, and preferably 1 to 2.

The radiation sensitive resin composition may contain in addition to the polymer (A) and the acid generator (B) that are essential components, the polymer (C) that is a suitable component as a base polymer, a solvent, an acid diffusion controller, a surfactant, an alicyclic skeleton-containing compound, a sensitizing agent and the like as other optional components in the range not to impair the effects of the invention. Hereinafter, each of the components is explained in detail.

[Solvent]

The radiation sensitive resin composition generally contains a solvent. The solvent is not particularly limited as long as it can dissolve at least the polymer (A) and the acid generator (B) that are essential components, the polymer (C) that is a suitable component, and other optional components to be added if necessary. Examples of the solvent include alcohol type solvents, ether type solvents, ketone type solvents, amide type solvents, ester type solvents and mixed solvents of the same, and the like.

Examples of the alcohol type solvent include monoalcohol type solvents such as methanol, ethanol, n-propanol, iso-propanol, n-butanol, iso-butanol, sec-butanol, tert-butanol, n-pentanol, iso-pentanol, 2-methylbutanol, sec-pentanol, tert-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol and diacetone alcohol; polyhydric alcohol type solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol and tripropylene glycol; partially etherified polyhydric alcohol solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether and dipropylene glycol monopropyl ether, and the like.

Examples of the ether type solvent include diethyl ether, dipropyl ether, dibutyl ether, diphenyl ether, methoxybenzene, and the like.

Examples of the ketone type solvent include acetone, methyl ethylketone, methyl n-propylketone, methyl n-butylketone, diethyl ketone, methyl iso-butylketone, methyl n-pentylketone, ethyl n-butylketone, methyl n-hexylketone, diiso-butylketone, trimethylnonanone, cyclopentanone, cyclohexanone, cycloheptanone, cyclooctanone, methylcyclohexanone, 2,4-pentanedione, acetonyl acetone and acetophenone.

Examples of the amide type solvent include N,N'-dimethylimidazolidinone, N-methylformamide, N,N-dimethylformamide, N,N-diethylformamide, acetamide, N-methylacetamide, N,N-dimethylacetamide, N-methylpropionamide, N-methylpyrrolidone, and the like.

Examples of the ester type solvent include diethyl carbonate, propylene carbonate, methyl acetate, ethyl acetate, γ-butyrolactone, γ-valerolactone, n-propyl acetate, iso-propyl acetate, n-butyl acetate, iso-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, acetic acid ethylene glycol monomethyl ether, acetic acid ethylene glycol monoethyl ether, acetic acid diethylene glycol monomethyl ether, acetic acid diethylene glycol monoethyl ether, acetic acid diethylene glycol mono-n-butyl ether, acetic acid propylene glycol monomethyl ether, acetic acid propylene glycol monoethyl ether, acetic acid propylene glycol monopropyl ether, acetic acid propylene glycol monobutyl ether, acetic acid dipropylene glycol monomethyl ether, acetic acid dipropylene glycol monoethyl ether, diacetic acid glycol, acetic acid methoxytriglycol, ethyl propionate, n-butyl propionate, iso-amyl propionate, diethyl oxalate, di-n-butyl oxalate, methyl lactate, ethyl lactate, n-butyl lactate, n-amyl lactate, diethyl malonate, dimethyl phthalate, diethyl phthalate, and the like.

Examples of the hydrocarbon type solvent include aliphatic hydrocarbon type solvents such as n-pentane, iso-pentane, n-hexane, iso-hexane, n-heptane, iso-heptane, 2,2,4-trimethyl pentane, n-octane, iso-octane, cyclohexane and methylcyclohexane; aromatic hydrocarbon type solvents such as benzene, toluene, xylene, mesitylene, ethylbenzene, trimethyl benzene, methylethylbenzene, n-propylbenzene, iso-propylbenzene, diethyl benzene, iso-butylbenzene, triethylbenzene, diiso-propylbenzene and n-amyl naphthalene, and the like.

Of these, acetic acid propylene glycol monomethyl ether, and cyclohexanone are preferred. These solvents may be used wither alone, or in combination of two or more thereof.

[Acid Diffusion Controller]

The acid diffusion controller exhibits an effect of controlling a phenomenon of diffusion of an acid, which is generated by the acid generator (B) upon exposure, in the resist film, and inhibiting undesired chemical reaction in an unexposed region. This enables the storage stability of the radiation sensitive resin composition to be further improved and the resolution of the resist to be further improved, and an alteration of line width of the resist pattern due to varying post-exposure delay (PED) to be prevent so that a composition that exhibits excellent process stability can be obtained. The acid diffusion controller may be contained in the composition in a free compound form or in an incorporated form as a part of the polymer, or in both of these forms.

Examples of the acid diffusion control agent include amine compounds, amide group-containing compounds, urea compounds, nitrogen-containing heterocyclic compounds, and the like.

Examples of the amine compound include mono(cyclo)alkylamines; di(cyclo)alkylamines; tri(cyclo)alkylamines; substituted alkylaniline and derivatives thereof; ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis(1-(4-aminophenyl)-1-methylethyl)benzene, 1,3-bis(1-(4-aminophenyl)-1-methylethyl)benzene, bis(2-dimethylaminoethyl) ether, bis(2-diethylaminoethyl)ether, 1-(2-hydroxyethyl)-2-imidazolidinone, 2-quinoxalinol, N,N,N',N'-tetrakis(2-hydroxypropyl)ethylenediamine, N,N,N',N''N''-pentamethyldiethylenetriamine, and the like.

Examples of the amide group-containing compound include N-t-butoxycarbonyl group-containing amino compounds, formamide, N-methylformamide, N,N-dimethylformamide, acetamide, N-methylacetamide, N,N-dimethylacetamide, propionamide, benzamide, pyrrolidone, N-methylpyrrolidone, N-acetyl-1-adamantylamine, tris(2-hydroxyethyl) isocyanurate, and the like.

Examples of the urea compound include urea, methylurea, 1,1-dimethylurea, 1,3-dimethylurea, 1,1,3,3-tetramethylurea, 1,3-diphenylurea, tri-n-butylthiourea, and the like.

Examples of the nitrogen-containing heterocyclic compound include imidazoles; pyridines; piperazines; pyrazine, pyrazole, pyridazine, quinoxaline, purine, pyrrolidine, piperidine, piperidine ethanol, 3-piperidino-1,2-propanediol, morpholine, 4-methylmorpholine, 1-(4-morpholinyl)ethanol, 4-acetyl morpholine, 3-(N-morpholino)-1,2-propanediol, 1,4-dimethylpiperazine, 1,4-diazabicyclo[2.2.2]octane, and the like.

Moreover, a photodegradable base that generates a weak acid upon exposure may be also used as the acid diffusion control agent. An exemplary photodegradable base includes onium salt compounds that lose acid-diffusion controllability through decomposition due to exposure. Examples of the onium salt compounds include sulfonium salt compounds represented by the following formula (6) and iodonium salt compounds represented by the following formula (7).

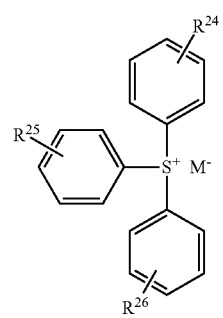

(6)

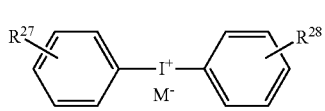

(7)

In the formula (6) and formula (7), $R^{24}$ to $R^{28}$ each independently represent a hydrogen atom, an alkyl group, an alkoxyl group, a hydroxyl group or a halogen atom; also in the formula (6) and formula (7), $M^-$ is $OH^-$, $R^{29}$—$COO^-$ or $R^{29}$—$SO_3^-$, wherein $R^{29}$ represents an alkyl group, an aryl group, an alkaryl group or an anion represented by the following formula (8).

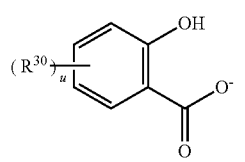

(8)

In the formula (8), $R^{30}$ represents a linear or branched alkyl group having 1 to 12 carbon atoms in which a part or all of hydrogen atoms may be substituted with a fluorine atom, or a linear or branched alkoxyl group having 1 to 12 carbon atoms; and u is 1 or 2.

These acid diffusion control agents may be used either alone, or in combination of at least two types thereof. The content of the acid diffusion control agent is preferably no less than 0.01 parts by mass and no greater than 5 parts by mass with respect to 100 parts by mass of the polymer (C). When the total amount added exceeds 5 parts by mass, sensitivity of the resultant resist is likely to be inferior.

[Surfactant]

The surfactant exhibits effects of improving coating properties, striation, developability, and the like. Examples of the surfactant include nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate and polyethylene glycol distearate, as well as trade names KP341 (Shin-Etsu Chemical Co., Ltd.), Polyflow No. 75 and Polyflow No. 95 (Kyoeisha Chemical Co., Ltd.), EFTOP EF301, EFTOP EF303 and EFTOP EF352 (all manufactured by Tochem Products Corporation), Megaface® F171 and Megaface® F173 (Dainippon Ink And Chemicals, Incorporated), Fluorad™ FC430 and Fluorad FC431 (Sumitomo 3M Limited), ASAHI GUARD AG710, Surflon S-382, Surflon SC-101, Surflon SC-102, Surflon SC-103, Surflon SC-104, Surflon SC-105 and Surflon SC-106 (Asahi Glass Co., Ltd.), and the like. These surfactants may be used either alone, or in combination of at least two types thereof.

[Alicyclic Skeleton-Containing Compound]

The alicyclic skeleton-containing compound has effects of improving the dry etching resistance, pattern configuration, adhesiveness to a substrate, and the like.

Examples of the alicyclic skeleton-containing compound include adamantane derivatives such as 1-adamantanecarboxylic acid, 2-adamantanone and t-butyl 1-adamantanecarboxylate; deoxycholic acid esters such as t-butyl deoxycholate, t-butoxycarbonylmethyl deoxycholate and 2-ethoxyethyl deoxycholate; lithocholic acid esters such as t-butyl lithocholate, t-butoxycarbonylmethyl lithocholate and 2-ethoxyethyl lithocholate; 3-[2-hydroxy-2,2-bis(trifluoromethyl)ethyl]tetracyclo[4.4.0.1$^{2,5}$·1$^{7,10}$]dodecane, 2-hydroxy-9-methoxycarbonyl-5-oxo-4-oxa-tricyclo [4.2.1.0$^{3,7}$]nonane, and the like. These alicyclic skeleton-containing compounds may be used either alone, or in combination of two or more thereof.

[Sensitizing Agent]

The sensitizing agent serves in increasing the amount of the acid generator (B) produced, and has an effect of improving "apparent sensitivity" of the radiation sensitive resin composition.

Examples of the sensitizing agent include carbazoles, acetophenones, benzophenones, naphthalenes, phenols, biacetyl, eosin, rose bengal, pyrenes, anthracenes, phenothiazines, and the like. These sensitizing agents may be used either alone, or in combination of at least two types thereof.

<Preparation of Radiation Sensitive Resin Composition>

The radiation sensitive resin composition may be prepared by, for example, mixing the polymer (A), the acid generator (B), the polymer (C), and other optional component(s) at each predetermined proportion in an organic solvent. Further, the radiation sensitive resin composition may be prepared and used in a state being dissolved or dispersed in an appropriate organic solvent.

<Method for Forming Pattern>

The method for forming a pattern includes: (1) a film forming step of forming a resist film by applying the radiation sensitive resin composition of the embodiment of the present invention on a substrate; (2) an exposure step by irradiating at least a part of the resist film with a radioactive ray by liquid immersion lithography to permit exposure, (3) a heating step of heating the exposed resist film, and (4) a development step f developing the heated resist film. According to the method for forming a pattern, development defects such as bridge defects are inhibited, and thus fine pattern having superior shape can be formed. Each step is explained in detail below.

[Step (1)]

In the step (1), the radiation sensitive resin composition of the embodiment of the present invention is applied on a substrate to form a resist film. Examples of the substrate which may be used include conventionally well-known substrates such as silicon wafers and wafers coated with aluminum. Moreover, an organic or inorganic antireflection film disclosed in, for example, Japanese Examined Patent Application, Publication No. H6-12452, Japanese Unexamined Patent Application, Publication No. S59-93448 and the like may be formed on the substrate.

The process of application may involve, for example, spin coating, cast coating, roll coating, and the like. It is to be noted that the formed resist film has a film thickness of usually 0.01 μm to 1 μm, and preferably 0.01 μm to 0.5 μm.

After the radiation sensitive resin composition is applied, the solvent in the coated film may be evaporated by prebaking (PB) as needed. Heating conditions of PB may be appropriately determined depending on the blend of the composition, and the temperature is usually about 30° C. to 200° C. and preferably 50° C. to 150° C.

In order to prevent influences from basic impurities and the like included in an environmental atmosphere, a protective film disclosed in, for example, Japanese Unexamined Patent Application, Publication No. H5-188598 and the like may be also provided on the resist layer. Furthermore, in order to prevent outflow of the acid generating agent and the like from the resist layer, a protective film for liquid immersion disclosed in, for example, Japanese Unexamined Patent Application, Publication No. 2005-352384 and the like may be provided on the resist layer. It is to be noted that these techniques may be used in combination.

[Step (2)]

In the step (2), exposure is carried out by reduction projection through a mask having a specific pattern and a liquid for liquid immersion if necessary on a desired region of the resist film formed in the step (1). The radioactive ray used in the exposure may be appropriately selected depending on the type of the acid generator (B), and examples include ultraviolet rays, far ultraviolet rays, X-rays, charged particle rays, and the like. Of these, far ultraviolet rays typified by ArF excimer laser and KrF excimer laser (wavelength: 248 nm) are preferred, and ArF excimer laser is more preferred. Conditions of the exposure such as exposure dose may be determined appropriately depending on the blend of the radiation sensitive resin composition and the type of the additive, and the like. In the method for forming a pattern of the embodiment of the present invention, the exposure step may be repeated multiple times, and in the exposure repeated multiple times, either the same light source or different light source may be used, but use of an ArF excimer laser beam is preferred for the first exposure.

[Step (3)]

In the step (3), post exposure baking (PEB) is carried out after the exposure. By carrying out the PEB, a dissociating reaction of the acid-dissociable group in the radiation sensitive resin composition can smoothly proceed. In heating conditions of PEB, the heating temperature is usually no lower than 30° C. and lower than 200° C., preferably no lower than 50° C. and lower than 150° C., and more preferably no lower than 60° C. and lower than 100° C. At a temperature lower than 30° C., the dissociating reaction may not smoothly proceed, whereas at a temperature of no lower than 200° C., an acid generated from the acid generator (B) is broadly diffused over sites unexposed with light, whereby obtaining a favorable pattern may fail.

[Step (4)]

In the step (4), the heated photoresist film after the exposure is developed with a developer solution to form a predetermined photoresist pattern. After the development, washing with water and drying generally follow. Examples of preferable developer solution include aqueous alkali solutions prepared by dissolving at least one alkaline compound such as sodium hydroxide, potassium hydroxide, sodium carbonate, sodium silicate, sodium metasilicate, ammonia water, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene or 1,5-diazabicyclo-[4.3.0]-5-nonene. The polymer (A) contained in the radiation sensitive resin composition has a plurality of alkali-dissociable groups. Therefore, according to the resist film formed from the radiation sensitive resin composition, affinity to a developer solution can be improved due to dissociation of the alkali-dissociable group by the aforementioned treatment with an alkaline developer. As a result, occurrence of blob defects, bridge defects and the like is inhibited, whereby formation of a fine pattern with excellent pattern configuration is enabled.

The development process may involve, for example, a method in which a substrate is immersed in a bath charged with a developer solution for a certain time period (dipping method), a method in which a developer solution is put up on the surface of a substrate by way of the surface tension and allowing to stand still for a certain time period to permit development (paddling method), a method in which a developer solution is sprayed on the surface of a substrate (spraying method), a method in which application of a developer solution is continued while scanning a nozzle for discharging a developer solution at a constant speed on a substrate that is rotating at a constant speed (dynamic dispensing method), and the like.

<Polymer>

The polymer of the embodiment of the present invention includes the group represented by the above formula (1). Since the polymer includes the group having the aforementioned specific structure that includes a plurality of alkali-dissociable groups, the radiation sensitive resin composition that contains the polymer can improve affinity to a developer solution upon alkali development while securing the hydrophobicity during liquid immersion lithography, and inhibition of occurrence of development defects such as blob defects is enabled. It is to be noted that since the polymer was explained above in detail as the polymer (A) contained in the radiation sensitive resin composition, explanation of the polymer in this section is omitted.

<Compound>

The compound of the embodiment of the present invention is represented by the above formula (0), and is suitably used as a material for synthesizing the polymer, i.e., a monomer compound that gives the structural unit (I). Since the compound was explained above in detail as the monomer compound that gives the structural unit (I) included in the polymer (A), explanation of the compound in this section is omitted.

EXAMPLES

Hereinafter, the present invention is explained in more detail by way of Examples, but the present invention is not limited thereto.

The Mw and the Mn of the polymer were determined using GPC columns (Tosoh Corporation, G2000HXL×2, G3000HXL×1, G4000HXL×1) under conditions described below.

column temperature: 40° C.
elution solvent: tetrahydrofuran (Wako Pure Chemical Industries, Ltd.)
flow rate: 1.0 mL/min
sample concentration: 1.0% by mass
amount of sample injected: 100 μL
detector: differential refractometer
standard substance: mono-dispersionpolystyrene $^{13}$C-NMR analysis was carried out using a nuclear magnetic resonance apparatus (JEOL, Ltd., JNM-EX270) for the measurement.

Synthesis of Compound

Example 1-1

Synthesis of Compound (M-1)

In a 1 L reaction flask were charged 40 g of 2-bromoethanol (0.32 mol) and 53 g of t-butyldimethylchlorosilane, and thereto was added 400 mL of tetrahydrofuran (THF). The THF solution thus obtained was cooled to 0° C., and thereto was slowly added dropwise a THF solution prepared by dissolving 36 g of triethylamine (0.35 mol) and 3.9 g of N,N-dimethyl-4-aminopyridine (0.03 mmol) in 100 mL of THF, followed by stirring the mixture at room temperature for 10 hrs. After completing the reaction, precipitates thus generated were removed by suction filtration and then THF in the liquid layer was distilled off by an evaporator, and the residue was extracted with ethyl acetate, followed by washing with water and saturated saline and drying the organic layer over anhydrous magnesium sulphate. Thereafter, a residue obtained by vacuum concentration was purified by vacuum distillation to obtain 66.0 g (yield: 86%) of a compound represented by the following formula (m-1).

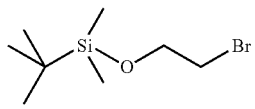

(m-1)

In a nitrogen atmosphere, 12.7 g of sodium hydride (0.32 mol) containing 40% oil was placed into a 1 L reaction flask, and thereto was added 500 mL of anhydrous THF. The THF solution thus obtained was cooled to 0° C., and thereto was slowly added dropwise 80.2 g of di t-butyl malonate (0.37 mol), followed by stirring the mixture at room temperature for 2 hrs. Thereafter, 63.4 g (0.27 mol) of the compound (m-1) was slowly added dropwise at 0° C., and the mixture was stirred at 40° C. for 15 hrs. After completing the reaction, precipitates thus generated were removed by suction filtration and then THF in the liquid layer was distilled off by an evaporator, and the residue was extracted with ethyl acetate, followed by washing with water and saturated saline and drying the organic layer over anhydrous magnesium sulphate. Thereafter, a residue obtained by vacuum concentration was placed in a 1 L eggplant flask, and thereto were added 150 mL of 1 N hydrochloric acid, 150 mL of methanol and 400 mL of THF, followed by stirring the mixture at room temperature for 8 hrs. The mixture was neutralized with an aqueous sodium bicarbonate solution and then the liquid layer was distilled off by an evaporator, and the residue was extracted with ethyl acetate, followed by washing with water and saturated saline and drying the organic layer over anhydrous magnesium sulphate. Thereafter, a residue obtained by vacuum concentration was purified by vacuum distillation to obtain 56.2 g (yield: 80%) of a compound represented by the following formula (m-2).

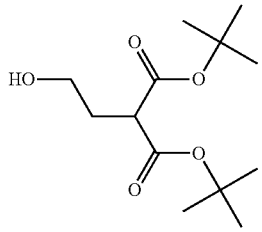

(m-2)

In a nitrogen atmosphere, 56.0 g (0.22 mol) of the compound (m-2) and 32.7 g of triethylamine (0.32 mol) were placed into a 1 L reaction flask, and thereto was added 500 mL of toluene. The toluene solution thus obtained was cooled to 0° C., and thereto was slowly added dropwise 23.6 g of chloride methacrylate (0.23 mol), followed by stirring the mixture at room temperature for 4 hrs. After completing the reaction, precipitates thus generated were removed by suction filtration and then toluene in the liquid layer was distilled off by an evaporator, and the residue was extracted with ethyl acetate, followed by washing with water and saturated saline and drying the organic layer over anhydrous magnesium sulphate. Thereafter, a residue obtained by vacuum concentration was purified by silica gel column chromatography (developing solvent: hexane/ethyl acetate=8/1) to obtain 43.1 g (yield: 60%) of a compound represented by the following formula (m-3).

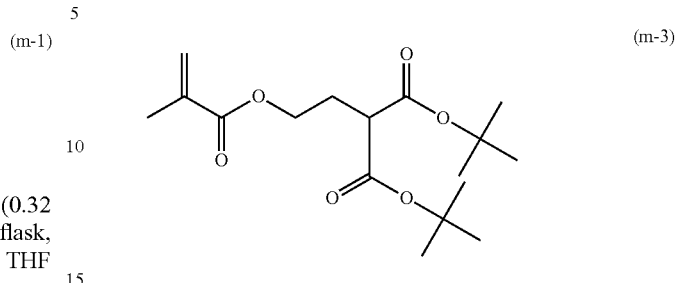

(m-3)

The compound (m-3) in an amount of 12.0 g (37 mmol) was placed into a 300 mL eggplant flask, and thereto was added 50 mL of trifluoroacetic acid, followed by stirring the mixture at room temperature for 10 hrs. After completing the reaction, mL of toluene was added to the reaction solution, and toluene and trifluoroacetic acid were distilled off using an evaporator. To the residue was added 50 mL of toluene again, which was distilled off, and this procedure was repeated three times, whereby trifluoroacetic acid was completely eliminated. Thereafter, the precipitated white solid was washed with hexane, and subjected to suction filtration to obtain 7.2 g (yield: 90%) of a compound represented by the following formula (m-4).

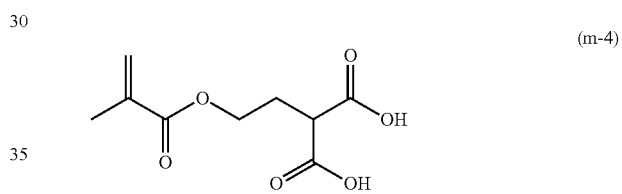

(m-4)

In a nitrogen atmosphere, 2.3 g (10.6 mmol) of the compound (m-4) and 3.6 g of oxalyl chloride (28.6 mmol) were placed into a 200 mL reaction flask, and thereto was added 100 mL of anhydrous THF. A few drops of DMF were added thereto, and the mixture was stirred at room temperature for 2 hrs while trapping the acid generated. The THF solution was cooled to 0° C., and after adding 2.7 g of 2,2,2-trifluoroethanol (26.5 mmol) thereto, 5.9 g of triethylamine (58.3 mmol) was slowly added dropwise, followed by stirring the mixture at room temperature for 5 hrs. After completing the reaction, precipitates thus generated were removed by suction filtration and then THF in the liquid layer was distilled off by an evaporator, and the residue was extracted with ethyl acetate, followed by washing with water and saturated saline and drying the organic layer over anhydrous magnesium sulphate. Thereafter, a residue obtained by vacuum concentration was purified by silica gel column chromatography (developing solvent: hexane/ethyl acetate=8/1) to obtain 1.7 g (yield: 43%) of a compound represented by the following formula (M-1). $^1$H-NMR data of the obtained compound (M-1) are shown below.

$^1$H-NMR (CDCl$_3$) δ: 1.91 (s, 3H, CH$_3$), 2.35 (q, 2H, CH$_2$), 3.59 (t, 1H, CH), 4.24 (t, 2H, CH$_2$), 4.54 (m, 4H, CH$_2$), 5.53 (s, 1H, CH), 6.11 (s, 1H, CH)

Example 1-2

Synthesis of Compound (M-2)

In a nitrogen atmosphere, 20.0 g of dimethyl DL-malate (0.12 mol) and 18.5 g of triethylamine (0.18 mol) were placed into a 1 L reaction flask, and thereto was added 300 mL of toluene. The toluene solution thus obtained was cooled to 0° C., and thereto was slowly added dropwise 13.3 g of chloride methacrylate (0.13 mol), followed by stirring the mixture at room temperature for 3 hrs. After completing the reaction, precipitates thus generated were removed by suction filtration and then toluene in the liquid layer was distilled off by an evaporator, and the residue was extracted with ethyl acetate, followed by washing with water and saturated saline and drying the organic layer over anhydrous magnesium sulphate. Thereafter, a residue obtained by vacuum concentration was purified by silica gel column chromatography (developing solvent: hexane/ethyl acetate=8/1) to obtain 23.8 g (yield: 84%) of a compound represented by the following formula (m-5).

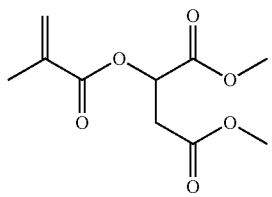

(m-5)

The compound (m-5) in an amount of 4.2 g (18.2 mmol) was placed into a 200 mL eggplant flask, and thereto was added 30 mL of a mixed solvent of methanol/water=5/1. The mixed solvent was cooled to 0° C., and thereto was added 3 g of a 10% aqueous lithium hydroxide solution, followed by stirring the mixture for 1 hour while maintaining the temperature at 0° C. After completing the reaction, the solvent was distilled off using an evaporator. Thereafter, a series of operation including adding 100 mL of toluene to the residue, and distilling off the solvent again was repeated three times, whereby water was eliminated. The residue was purified by silica gel column chromatography (developing solvent: ethyl acetate/methanol=8/1) to obtain 1.9 g (yield: 52%) of a compound represented by the following formula (m-6).

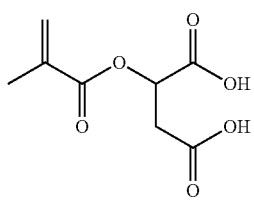

(m-6)

In a nitrogen atmosphere, 1.8 g (8.9 mmol) of the compound (m-6) and 3.1 g of oxalyl chloride (24.0 mmol) were placed into a 200 mL reaction flask, and thereto was added 80 mL of anhydrous THF. A few drops of DMF were added thereto, and the mixture was stirred at room temperature for 2 hrs while trapping the acid generated. The THF solution was cooled to 0° C., and after adding 3.7 g of hexafluoro-2-propanol (22.3 mmol) thereto, 5.0 g of triethylamine (49.0 mmol) was slowly added dropwise, followed by stirring the mixture at room temperature for 4 hrs. After completing the reaction, precipitates thus generated were removed by suction filtration and then THF in the liquid layer was distilled off by an evaporator, and the residue was extracted with ethyl acetate, followed by washing with water and saturated saline and drying the organic layer over anhydrous magnesium sul-phate. Thereafter, a residue obtained by vacuum concentration was purified by silica gel column chromatography (developing solvent: hexane/ethyl acetate=8/1) to obtain 2.3 g (yield: 51%) of a compound represented by the following formula (M-2). $^1$H-NMR data of the obtained compound (M-2) are shown below.

$^1$H-NMR (CDCl$_3$) δ: 1.91 (s, 3H, CH$_3$), 2.65 (d, 2H, CH$_2$), 5.42 (t, 1H, CH), 5.53 (s, 1H, CH), 5.79 (m, 2H, CH), 6.11 (s, 1H, CH)

Example 1-3

Synthesis of Compound (M-3)

In a 1 L reaction flask were charged 40 g of 5-norbornene-2,3-dicarboxylic anhydride (0.24 mmol) and 300 mL of formic acid, and the mixture was stirred at 90° C. for 110 hrs. After completing the reaction, the reaction solution was neutralized by adding a saturated aqueous sodium bicarbonate solution, and the residue was extracted with ethyl acetate, followed by washing with water and saturated saline and drying the organic layer over anhydrous magnesium sulphate. Thereafter, a residue obtained by vacuum concentration was placed into a 500 mL eggplant flask, and thereto were added 200 mL of THF and 30 mL of 2 mol/L sodium hydroxide aqueous solution, followed by stirring the mixture at 60° C. for 2 hrs. After completing the reaction, the solvent was distilled off using an evaporator. Thereafter, a series of operation of adding 200 mL of toluene to the residue, and distilling off the solvent again was repeated three times, whereby water was eliminated. The residue was purified by silica gel column chromatography (developing solvent: ethyl acetate/methanol=8/1) to obtain 23.4 g (yield: 48%) of a compound represented by the following formula (m-7).

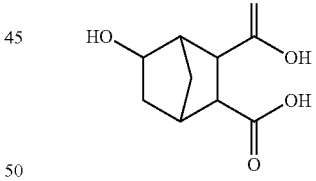

(m-7)

In a 1 L reaction flask were charged 20.0 g (0.10 mol) of the compound (m-7), 25.7 g of N,N-dimethyl-4-aminopyridine (0.21 mol) and 43.3 g of N,N-dicyclohexyl carbodiimide (0.21 mol), and thereto was added 400 mL of tert-butanol, followed by stirring the mixture at 80° C. for 21 hrs. After completing the reaction, precipitates thus generated were removed by suction filtration and then tert-butanol in the liquid layer was distilled off by an evaporator, and the residue was extracted with ethyl acetate, followed by washing with water and saturated saline and drying the organic layer over anhydrous magnesium sulphate. Thereafter, a residue obtained by vacuum concentration was purified by silica gel column chromatography (developing solvent: hexane/ethyl acetate=4/1) to obtain 19.4 g (yield: 62%) of a compound represented by the following formula (m-8).

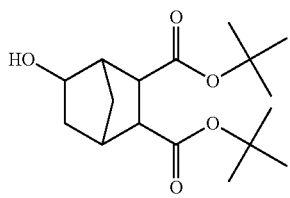

(m-8)

In a nitrogen atmosphere, 22.0 g (70 mmol) of the compound (m-8) and 10.7 g of triethylamine (106 mmol) were placed into a 1 L reaction flask, and thereto was added 400 mL of toluene. The toluene solution was cooled to 0° C., and thereto was slowly added dropwise 7.7 g of chloride methacrylate (74 mmol), followed by stirring the mixture at room temperature for 4 hrs. After completing the reaction, precipitates thus generated were removed by suction filtration and then toluene in the liquid layer was distilled off by an evaporator, and the residue was extracted with ethyl acetate, followed by washing with water and saturated saline and drying the organic layer over anhydrous magnesium sulphate. Thereafter, a residue obtained by vacuum concentration was purified by silica gel column chromatography (developing solvent: hexane/ethyl acetate=8/1) to obtain 22.5 g (yield: 84%) of a compound represented by the following formula (m-9).

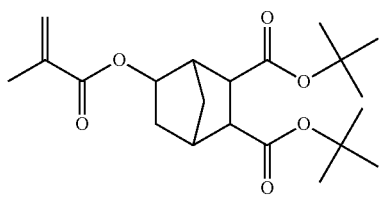

(m-9)

The compound (m-9) in an amount of 17.2 g (45 mmol) was placed into a 300 mL eggplant flask, and thereto was added 100 mL of trifluoroacetic acid, followed by stirring the mixture at room temperature for 10 hrs. After completing the reaction, 100 mL of toluene was added to the reaction solution, and then toluene and trifluoroacetic acid were distilled off using an evaporator. To the residue was added 100 mL of toluene again, which was distilled off, and this procedure was repeated three times, whereby trifluoroacetic acid was completely eliminated. Thereafter, the precipitated white solid was washed with hexane, and subjected to suction filtration to obtain 11.3 g (yield: 93%) of a compound represented by the following formula (m-10).

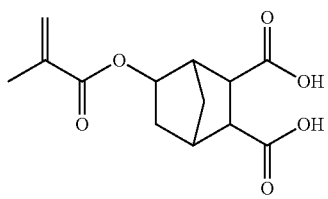

(m-10)

In a nitrogen atmosphere, 2.3 g (8.6 mmol) of the compound (m-10) and 2.9 g of oxalyl chloride (23 mmol) were placed into a 300 mL reaction flask, and thereto was added 100 mL of anhydrous THF. A few drops of DMF were added thereto, and the mixture was stirred at room temperature for 2 hrs while trapping the acid generated. THF solution was cooled to 0° C., and after adding 3.5 g of 3-hydroxybenzotrifluoride (22 mmol) thereto, 4.8 g of triethylamine (47 mmol) was slowly added dropwise, followed by stirring the mixture at room temperature for 5 hrs. After completing the reaction, precipitates thus generated were removed by suction filtration and then THF in the liquid layer was distilled off by an evaporator, and the residue was extracted with ethyl acetate, followed by washing with water and saturated saline and drying the organic layer over anhydrous magnesium sulphate. Thereafter, a residue obtained by vacuum concentration was purified by silica gel column chromatography (developing solvent: hexane/ethyl acetate=8/1) to obtain 2.2 g (yield: 45%) of a compound represented by the following formula (M-3). $^1$H-NMR data of the obtained compound (M-3) are shown below.

$^1$H-NMR (CDCl$_3$) δ: 1.70 (m, 2H, CH$_2$), 1.90 (s, 3H, CH$_3$), 1.70-2.23 (m, 4H), 2.58 (m, 1H, CH), 2.67 (m, 1H, CH), 4.02 (m, 1H, CH), 5.53 (s, 1H, CH), 6.11 (s, 1H, CH), 7.24-7.40 (m, 6H), 7.69 (s, 2H, CH)

Example 1-4

Synthesis of Compound (M-4)

In a nitrogen atmosphere, 5.0 g of triethyl citrate (18.1 mmol), 3.7 g of triethylamine (36.6 mmol) and 0.6 g of 1,4-diazabicyclo[2,2,2]octane (5.3 mmol) were placed into a 300 mL reaction flask, and thereto was added 100 mL of toluene. The toluene solution thus obtained was cooled to 0° C., and thereto was slowly added dropwise 2.0 g of chloride methacrylate (19.0 mmol), followed by stirring the mixture at room temperature for 4 hrs. After completing the reaction, precipitates thus generated were removed by suction filtration and then toluene in the liquid layer was distilled off by an evaporator, and the residue was extracted with ethyl acetate, followed by washing with water and saturated saline and drying the organic layer over anhydrous magnesium sulphate. Thereafter, a residue obtained by vacuum concentration was purified by silica gel column chromatography (developing solvent: hexane/ethyl acetate=8/1) to obtain 5.1 g (yield: 82%) of a compound represented by the following formula (m-11).

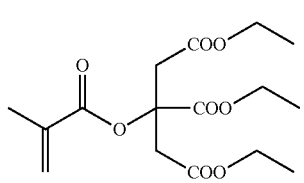

(m-11)

The compound (m-11) in an amount of 4.0 g (11.6 mmol) was placed into a 200 mL eggplant flask, and thereto was added 40 mL of a mixed solvent of methanol/water=5/1. The mixed solvent was cooled to 0° C., and thereto was added 4 g of a 10% aqueous lithium hydroxide solution, followed by stirring the mixture for 1 hour while maintaining the temperature at 0° C. After completing the reaction, the solvent was distilled off using an evaporator. Thereafter, a series of operation including adding 100 mL of toluene to the residue, and distilling off the solvent again was repeated three times, whereby water was eliminated. The residue was dissolved in a mixed solvent of ethyl acetate/methanol=8/1, and purified by silica gel column chromatography (developing solvent: ethyl acetate/methanol=8/1) to obtain 1.8 g (yield: 60%) of a compound represented by the following formula (m-12).

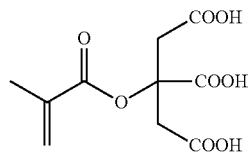
(m-12)

In a nitrogen atmosphere, 1.8 g (6.9 mmol) of the compound (m-12) and 3.5 g of oxalyl chloride (28 mmol) were placed into a 200 mL reaction flask, and thereto was added 70 mL of anhydrous THF. A few drops of DMF were added thereto, and the mixture was stirred at room temperature for 2 hrs while trapping the acid generated. THF solution was cooled to 0° C., and after adding 2.6 g of 2,2,2-trifluoroethanol (26 mmol) thereto, 4.9 g of triethylamine (48 mmol) was slowly added dropwise, followed by stirring the mixture at room temperature for 5 hrs. After completing the reaction, precipitates thus generated were removed by suction filtration and then THF in the liquid layer was distilled off by an evaporator, and the residue was extracted with ethyl acetate, followed by washing with water and saturated saline and drying the organic layer over anhydrous magnesium sulphate. Thereafter, a residue obtained by vacuum concentration was purified by silica gel column chromatography (developing solvent: hexane/ethyl acetate=8/1) to obtain 1.4 g (yield: 40%) of a compound represented by the following formula (M-4). $^1$H-NMR data of the obtained compound (M-4) are shown below.

$^1$H-NMR (CDCl$_3$) δ: 1.91 (s, 3H, CH$_3$), 3.24 (s, 4H, CH$_2$), 4.61 (m, 6H, CH$_2$), 5.53 (s, 1H, CH), 6.12 (s, 1H, CH)

Example 1-5

Synthesis of Compound (M-5)

In a nitrogen atmosphere, 18.0 g of propionaldehyde (0.31 mol), 49.1 g of chlorodifluoroethyl acetate (0.31 mol), and 20.3 g of zinc powder (0.31 mol) were placed into a 1 L reaction flask, and thereto was added 400 mL of anhydrous DMF, followed by stirring the mixture at 80° C. for 20 hrs. After completing the reaction, the precipitates were removed by suction filtration and then the liquid layer was extracted with ethyl acetate, followed by washing with water and saturated saline and drying the organic layer over anhydrous magnesium sulphate. Thereafter, a residue obtained by vacuum concentration was purified by silica gel column chromatography (developing solvent: hexane/ethyl acetate=4/1) to obtain 29.4 g (yield: 52%) of a compound represented by the following formula (m-13).

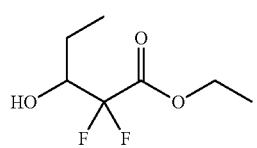
(m-13)

In a similar manner to Example 1-1 except that 4.3 g (26.5 mmol) of the compound (m-13) was used in place of 2,2,2-trifluoroethanol, 5.5 g (yield: 38%) of a compound represented by the following formula (M-5) was obtained. $^1$H-NMR data of the obtained compound (M-5) are shown below.

$^1$H-NMR (CDCl$_3$) δ: 0.97 (t, 6H, CH$_3$), 1.29 (t, 6H, CH$_3$), 1.69-1.87 (m, 4H, CH$_2$), 1.89 (s, 3H, CH$_3$), 2.33 (q, 2H, CH$_2$), 3.64 (t, 1H, CH), 4.19-4.31 (m, 6H, CH$_2$), 5.35 (m, 2H, CH), 5.60 (s, 1H, CH), 6.11 (s, 1H, CH)

Example 1-6

Synthesis of Compound (M-6)

In a similar manner to Example 1-5 except that 2.8 g (10.6 mmol) of the compound (m-12) was used in place of the compound (m-4), 2.8 g (yield: 35%) of a compound represented by the following formula (M-6) was obtained.

$^1$H-NMR data of the obtained compound (M-6) are shown below.

$^1$H-NMR (CDCl$_3$) δ: 0.99 (t, 9H, CH$_3$), 1.31 (t, 9H, CH$_3$), 1.69-1.87 (m, 6H, CH$_2$), 1.90 (s, 3H, CH$_3$), 3.31 (s, 4H, CH$_2$), 4.19-4.31 (m, 6H, CH$_2$), 5.35 (m, 3H, CH), 5.53 (s, 1H, CH), 6.12 (s, 1H, CH)

<Synthesis of (A) Polymer>

Monomers used for synthesizing the polymer (A) and the polymer (C) described below are shown below.

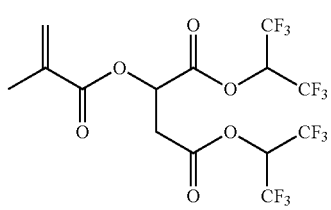
(M-1)

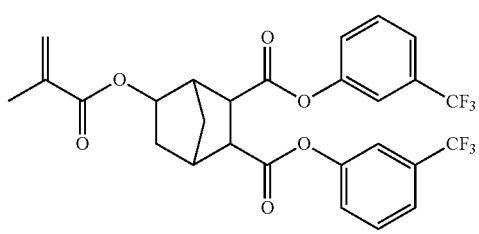
(M-2)

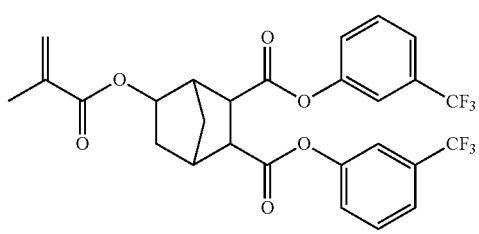
(M-3)

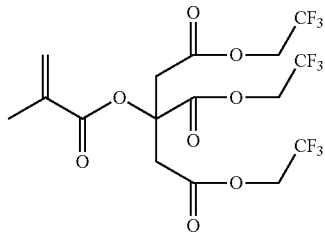
(M-4)

(M-5)

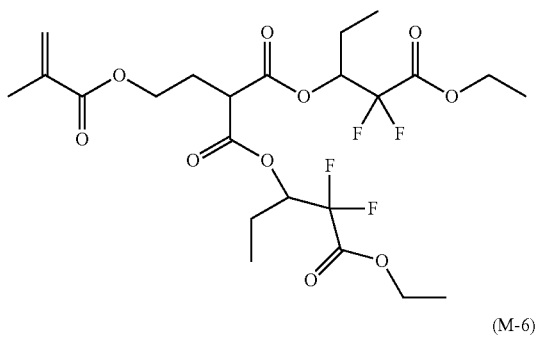

(M-6)

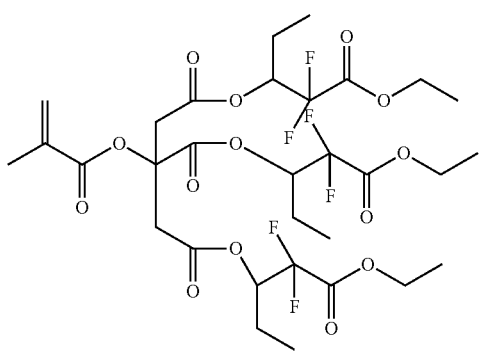

(M-7)

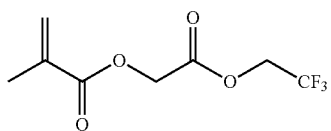

(M-8)

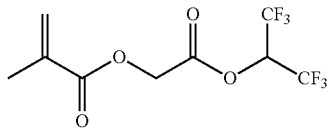

(M-9)

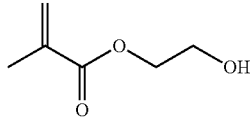

(M-10)

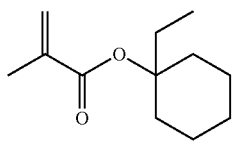

(M-11)

(M-12)

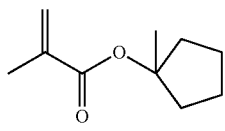

(M-13)

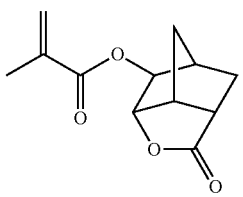

Example 2-1

In a 300 mL reaction flask were placed 7.4 g (60 mol %) of the compound (M-1), 2.6 g (40 mol %) of the compound (M-10) and 0.37 g of azobisisobutyronitrile (AIBN), and thereto was charged 20 g of 2-butanone. The mixture was heated to 80° C. with stirring under a nitrogen purge. A time point when the heating was started was defined as a start time of the polymerization reaction, and the polymerization reaction was allowed for 5 hrs. After completing the polymerization reaction, the solvent was distilled off such that a ratio of the amount of the solvent to the amount of the charged monomer became 0.5, and then the concentrated polymerization solvent was charged into 150 g of a mixed solvent of methanol/distilled water=2/1. Only white turbid supernatant liquid was eliminated by decantation such that the viscous solid produced did not run over. Thereafter, 20 g of a mixed solvent of methanol/distilled water=4/1 was added to the residue, whereby the viscous solid was washed, and again the supernatant liquid alone was eliminated by decantation. Washing of the viscous solid according to a similar procedure was repeated twice. Finally, the viscous solid was dried at 50° C. for 17 hrs to give polymer (A-1) (6.7 g, yield: 67%) as colorless transparent solid. The polymer (A-1) thus obtained had a Mw of 9,400, and a ratio Mw/Mn of 1.42. In addition, as a result of $^{13}$C-NMR analysis, a proportion of the content of the structural unit derived from the compound (M-1), to the content of the structural unit derived from the compound (M 10) was 57: 43 (mol %).

Examples 2-2 to 2-21

Comparative Examples 2-1 to 2-8

Polymers (A-2) to (A-21) and (a-1) to (a-8) were obtained in a similar manner to Example 2-1 except that the monomers listed in Table 1-1 and Table 1-2 were blended in predetermined amounts. Furthermore, the Mw, Mw/Mn and the yield of the obtained each polymer, as well as the contents of the structural units derived from each monomer contained in each polymer are also shown together with in Table 1-1 and Table 1-2.

TABLE 1-1

|  | Polymer | Compound type | amount blended (mol %) | Content of each structural unit (mol %) | Yield (%) | Mw | Mw/Mn |
|---|---|---|---|---|---|---|---|
| Example 2-1 | A-1 | M-1/M-10 | 60/40 | 57/43 | 67 | 9,400 | 1.42 |
| Example 2-2 | A-2 | M-1/M-11 | 70/30 | 68/32 | 63 | 9,700 | 1.39 |
| Example 2-3 | A-3 | M-1/M-9/M-10 | 60/10/30 | 58/9/33 | 64 | 9,500 | 1.42 |
| Example 2-4 | A-4 | M-2/M-10 | 60/40 | 58/42 | 65 | 9,900 | 1.42 |
| Example 2-5 | A-5 | M-2/M-11 | 70/30 | 68/32 | 60 | 11,000 | 1.39 |
| Example 2-6 | A-6 | M-2/M-9/M-10 | 60/10/30 | 59/8/33 | 61 | 9,800 | 1.43 |
| Example 2-7 | A-7 | M-3/M-10 | 60/40 | 59/41 | 72 | 9,200 | 1.41 |
| Example 2-8 | A-8 | M-3/M-11 | 70/30 | 69/31 | 72 | 9,300 | 1.41 |
| Example 2-9 | A-9 | M-3/M-9/M-10 | 60/10/30 | 59/8/33 | 69 | 9,700 | 1.42 |
| Example 2-10 | A-10 | M-1/M-3/M-10 | 25/35/40 | 23/33/44 | 66 | 9,400 | 1.42 |
| Example 2-11 | A-11 | M-1/M-3/M-11 | 30/40/30 | 29/38/33 | 68 | 9,400 | 1.42 |
| Example 2-12 | A-12 | M-1/M-3/M-9/M-10 | 25/35/10/30 | 24/32/10/34 | 66 | 9,700 | 1.43 |
| Example 2-13 | A-13 | M-4/M-10 | 60/40 | 55/45 | 58 | 8,600 | 1.44 |
| Example 2-14 | A-14 | M-4/M-11 | 70/30 | 65/35 | 54 | 8,800 | 1.43 |
| Example 2-15 | A-15 | M-4/M-9/M-10 | 60/10/30 | 54/9/37 | 56 | 8,800 | 1.44 |
| Example 2-16 | A-16 | M-5/M-10 | 60/40 | 59/41 | 66 | 9,900 | 1.43 |
| Example 2-17 | A-17 | M-5/M-11 | 70/30 | 67/33 | 64 | 11,000 | 1.42 |
| Example 2-18 | A-18 | M-5/M-9/M-10 | 60/10/30 | 58/10/32 | 66 | 9,900 | 1.43 |
| Example 2-19 | A-19 | M-6/M-10 | 60/40 | 55/45 | 53 | 8,300 | 1.44 |
| Example 2-20 | A-20 | M-6/M-11 | 70/30 | 65/35 | 51 | 8,400 | 1.45 |
| Example 2-21 | A-21 | M-6/M-9/M-10 | 60/10/30 | 54/10/36 | 56 | 8,500 | 1.43 |

TABLE 1-2

|  | Polymer | Compound type | amount blended (mol %) | Content of each structural unit (mol %) | Yield (%) | Mw | Mw/Mn |
|---|---|---|---|---|---|---|---|
| Comparative Example 2-1 | a-1 | M-7/M-10 | 60/40 | 60/40 | 73 | 10,800 | 1.38 |
| Comparative Example 2-2 | a-2 | M-7/M-11 | 70/30 | 69/31 | 71 | 11,100 | 1.39 |
| Comparative Example 2-3 | a-3 | M-7/M-9/M-10 | 60/10/30 | 58/10/32 | 71 | 10,800 | 1.37 |
| Comparative Example 2-4 | a-4 | M-8/M-10 | 60/40 | 59/41 | 68 | 11,200 | 1.36 |
| Comparative Example 2-5 | a-5 | M-8/M-11 | 70/30 | 69/31 | 68 | 11,200 | 1.38 |
| Comparative Example 2-6 | a-6 | M-8/M-9/M-10 | 60/10/30 | 60/9/31 | 67 | 11,400 | 1.37 |
| Comparative Example 2-7 | a-7 | M-7/M-10 | 90/10 | 88/12 | 46 | 12,100 | 1.32 |
| Comparative Example 2-8 | a-8 | M-7/M-9/M-10 | 80/10/10 | 78/9/11 | 44 | 12,200 | 1.34 |

Synthesis of (C) Polymer

Synthesis Example 1

The compound (M-13) in an amount of 33.11 g (40 mol %), the 12.22 g (10 mol %) of the compound (M-14) and 54.67 g (50 mol %) of the compound (M-15) were dissolved in 200 g of 2-butanone, and further 8.08 g of AIBN was charged to provide a monomer solution. On the other hand, 100 g of 2-butanone was charged into a 1,000 mL three-neck flask, and purged with nitrogen gas for 30 min. After the nitrogen purge, 2-butanone in the three-neck flask was heated to 80° C. while stirring. Subsequently, the monomer solution provided beforehand was added dropwise using a dripping funnel over 3 hrs. After completing the dropwise addition, the mixture was further stirred at 80° C. for 3 hrs. After the polymerization was completed, the polymerization solution was cooled to no higher than 30° C. by water cooling. Then, this polymerization reaction solution was charged into 2,000 g of methanol to allow white powder to be precipitated, which was thereafter filtered off. The filtered white powder was subjected to slurry scrubbing twice using 400 g of methanol, and thereafter filtered off. Next, the white powder (copolymer) was dried at 50° C. for 17 hrs (amount: 80.1 g, yield: 80%). The product is designated as polymer (C-1). This polymer (C-1) had a Mw of 7,300.

<Preparation of Radiation Sensitive Resin Composition>

The acid generating agent (B), the acid diffusion control agent and the solvent used for preparing each radiation sensitive resin composition were as in the following.

<(B) Acid Generating Agent>

A compound represented by the following formula (B-1):

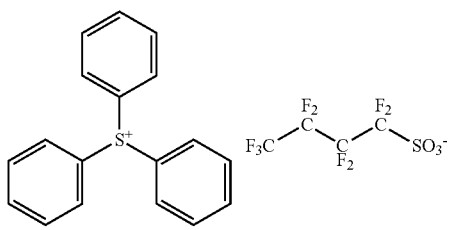
(B-1)

[Acid Diffusion Control Agent]

A compound represented by the following formula (D-1):

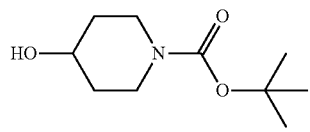
(D-1)

[Solvent]

The solvents used in Examples and Comparative Examples are shown below.

(E-1): propylene glycol monomethyl ether acetate
(E-2): cyclohexanone

Example 3-1

The polymer (A-1) obtained in Synthesis Example 1 in an amount of 5 parts by mass, 12 parts by mass of the compound represented by the above formula (B-1) as an acid generator, 100 parts by mass of the polymer (C-1) obtained in Synthesis Example 1, 0.8 parts by mass of the compound represented by the above formula (D-1) as an acid diffusion control agent, and as a solvent 1,980 parts by mass of (E-1) and 848 parts by mass of (E-2) were mixed, and the mixed solution obtained was filtered through a filter having a pore size of 0.20 μm to prepare a radiation sensitive resin composition.

Examples 3-1 to 3-21

Comparative Examples 3-1 to 3-8

Each radiation sensitive resin composition was prepared by carrying out an operation similar to that of Example 3-1 except that the formulation was as shown in Table 2-1 and Table 2-2.

TABLE 2-1

| | Composition | | | | | | | | | Results of evaluation | | |
|---|---|---|---|---|---|---|---|---|---|---|---|---|
| | (A) Component | | (B) Acid generating agent | | (C) | | Acid diffusion control agent | | Solvent | | Receding contact angle | | Development defect inhibitory ability |
| | type | parts by mass | type | parts by mass | Type | Component parts by mass | Type | parts by mass | Type | parts by mass | Post SB photoresist film | Post DEV photoresist film | |
| Example 3-1 | A-1 | 5 | B-1 | 12 | C-1 | 100 | D-1 | 0.8 | E-1/E-2 | 1,980/848 | B | B | B |
| Example 3-2 | A-2 | 5 | B-1 | 12 | C-1 | 100 | D-1 | 0.8 | E-1/E-2 | 1,980/848 | B | B | B |
| Example 3-3 | A-3 | 5 | B-1 | 12 | C-1 | 100 | D-1 | 0.8 | E-1/E-2 | 1,980/848 | B | B | B |
| Example 3-4 | A-4 | 5 | B-1 | 12 | C-1 | 100 | D-1 | 0.8 | E-1/E-2 | 1,980/848 | B | A | A |
| Example 3-5 | A-5 | 5 | B-1 | 12 | C-1 | 100 | D-1 | 0.8 | E-1/E-2 | 1,980/848 | B | A | A |
| Example 3-6 | A-6 | 5 | B-1 | 12 | C-1 | 100 | D-1 | 0.8 | E-1/E-2 | 1,980/848 | B | A | A |
| Example 3-7 | A-7 | 5 | B-1 | 12 | C-1 | 100 | D-1 | 0.8 | E-1/E-2 | 1,980/848 | A | A | A |
| Example 3-8 | A-8 | 5 | B-1 | 12 | C-1 | 100 | D-1 | 0.8 | E-1/E-2 | 1,980/848 | A | A | A |
| Example 3-9 | A-9 | 5 | B-1 | 12 | C-1 | 100 | D-1 | 0.8 | E-1/E-2 | 1,980/848 | A | A | A |
| Example 3-10 | A-10 | 5 | B-1 | 12 | C-1 | 100 | D-1 | 0.8 | E-1/E-2 | 1,980/848 | A | A | A |
| Example 3-11 | A-11 | 5 | B-1 | 12 | C-1 | 100 | D-1 | 0.8 | E-1/E-2 | 1,980/848 | A | A | A |
| Example 3-12 | A-12 | 5 | B-1 | 12 | C-1 | 100 | D-1 | 0.8 | E-1/E-2 | 1,980/848 | A | A | A |
| Example 3-13 | A-13 | 5 | B-1 | 12 | C-1 | 100 | D-1 | 0.8 | E-1/E-2 | 1,980/848 | A | A | A |
| Example 3-14 | A-14 | 5 | B-1 | 12 | C-1 | 100 | D-1 | 0.8 | E-1/E-2 | 1,980/848 | A | A | A |
| Example 3-15 | A-15 | 5 | B-1 | 12 | C-1 | 100 | D-1 | 0.8 | E-1/E-2 | 1,980/848 | A | A | A |
| Example 3-16 | A-16 | 5 | B-1 | 12 | C-1 | 100 | D-1 | 0.8 | E-1/E-2 | 1,980/848 | B | A | A |
| Example 3-17 | A-17 | 5 | B-1 | 12 | C-1 | 100 | D-1 | 0.8 | E-1/E-2 | 1,980/848 | B | A | A |
| Example 3-18 | A-18 | 5 | B-1 | 12 | C-1 | 100 | D-1 | 0.8 | E-1/E-2 | 1,980/848 | B | A | A |

TABLE 2-2

| | Composition | | | | | | | | | Results of evaluation | | |
|---|---|---|---|---|---|---|---|---|---|---|---|---|
| | (A) Component | | (B) Acid generating agent | | (C) | | Acid diffusion control agent | | Solvent | | Receding contact angle | | Development defect inhibitory ability |
| | type | parts by mass | type | parts by mass | Type | parts by mass | Type | parts by mass | Type | parts by mass | Post SB photoresist film | Post DEV photoresist film | |
| Example 3-19 | A-19 | 5 | B-1 | 12 | C-1 | 100 | D-1 | 0.8 | E-1/E-2 | 1,980/848 | A | A | A |
| Example 3-20 | A-20 | 5 | B-1 | 12 | C-1 | 100 | D-1 | 0.8 | E-1/E-2 | 1,980/848 | A | A | A |
| Example 3-21 | A-21 | 5 | B-1 | 12 | C-1 | 100 | D-1 | 0.8 | E-1/E-2 | 1,980/848 | A | A | A |
| Comparative Example 3-1 | a-1 | 5 | B-1 | 12 | C-1 | 100 | D-1 | 0.8 | E-1/E-2 | 1,980/848 | C | C | C |
| Comparative Example 3-2 | a-2 | 5 | B-1 | 12 | C-1 | 100 | D-1 | 0.8 | E-1/E-2 | 1,980/848 | C | C | C |
| Comparative Example 3-3 | a-3 | 5 | B-1 | 12 | C-1 | 100 | D-1 | 0.8 | E-1/E-2 | 1,980/848 | C | C | C |
| Comparative Example 3-4 | a-4 | 5 | B-1 | 12 | C-1 | 100 | D-1 | 0.8 | E-1/E-2 | 1,980/848 | B | C | C |
| Comparative Example 3-5 | a-5 | 5 | B-1 | 12 | C-1 | 100 | D-1 | 0.8 | E-1/E-2 | 1,980/848 | B | C | C |
| Comparative Example 3-6 | a-6 | 5 | B-1 | 12 | C-1 | 100 | D-1 | 0.8 | E-1/E-2 | 1,980/848 | B | C | C |
| Comparative Example 3-7 | a-7 | 5 | B-1 | 12 | C-1 | 100 | D-1 | 0.8 | E-1/E-2 | 1,980/848 | A | B | C |
| Comparative Example 3-8 | a-8 | 5 | B-1 | 12 | C-1 | 100 | D-1 | 0.8 | E-1/E-2 | 1,980/848 | B | B | C |

<Evaluation>

Evaluations of each of the radiation sensitive resin compositions were made according to the methods described below. The results of evaluation are shown in Table 2-1 and Table 2-2 all together.

[Measurement of Receding Contact Angle]

On an 8 inch silicon wafer was formed a film having a film thickness of 100 nm with each of the radiation sensitive resin compositions using CLEAN TRACK "ACT8" manufactured by Tokyo Electron Limited, and a "post SB photoresist film" which was a photoresist layer was provided by carrying out soft baking (SB) at 110° C. for 60 sec.

In a similar manner, a film having a film thickness of 100 nm was formed on an 8 inch silicon wafer with each radiation sensitive resin composition, and subjected to SB at 110° C. for 60 sec. Thereafter, the film was developed with a 2.38% by mass aqueous tetramethylammonium hydroxide solution using a GP nozzle attached to a development apparatus of CLEAN TRACK "ACT8" manufactured by Tokyo Electron Limited for 10 sec, followed by rinsing with pure water for 15 sec and spin drying at 2,000 rpm to give a photoresist layer as "post DEV photoresist film".

Thereafter, a receding contact angle of the film thus formed was measured under a condition involving a room temperature of 23° C., a humidity of 45% and an ordinary pressure, using DSA-10 manufactured by KRUS Electronics Ltd., according to the following procedure.

A needle of DSA-10 was washed with acetone and isopropyl alcohol prior to the measurement, then water was introduced into the needle, and the wafer was mounted on a wafer stage. The height of the stage was adjusted such that the distance between the surface of the wafer and the tip of the needle became no greater than 1 mm. Next, after water was discharged from the needle to provide a water droplet of 25 μL on the wafer, the contact angle was measured every second along with aspiration of the water droplet by the needle at a rate of 10 μL/min for 180 sec. With regard to the contact angles at twenty points in total after a stable contact angle was found, an average was calculated to determine the receding contact angle.

With respect to the receding contact angle of the post SB photoresist film, evaluation was made as "A" in the case of being no less than 80°, "B" in the case of being no less than 76° and less than 80°, and "C" in the case of being less than 76°. With respect to the receding contact angle of the post DEV photoresist film, evaluation was made as "C" in the case of being no less than 50°, "B" in the case of being no less than 35° and less than 50°, and "A" in the case of being less than 35°.

[Inhibitory Ability of Development Defect]

First, a film having a film thickness of 100 nm was formed with each of the radiation sensitive resin compositions on a 12 inch silicon wafer on which an underlayer antireflection film ("ARC66", manufactured by Nissan Chemical Industries, Ltd.) was formed, and soft baking (SB) was carried out at 110° C. for 60 sec. Next, this film was exposed through a mask pattern using an ArF excimer laser Immersion Scanner ("NSR S610C", manufactured by NIKON Corporation) under a condition involving NA of 1.3, with "Cross pole". After the exposure, post-baking (PEB) was carried out at 95° C. for 60 sec. Thereafter, development was carried out with a 2.38% by mass aqueous tetramethylammonium hydroxide solution, followed by washing with water and drying to form a positive type resist pattern. In this process, the exposure dose that forms line-and-space with a width of 48 nm was defined as "optimal exposure dose". A line-and-space pattern with a line width of 48 nm was formed at this optimal exposure dose on the entire face of the wafer to provide a wafer for inspection of defects. It is to be noted that for measuring the line-width, a scanning electron microscope ("CG-4000", manufactured by Hitachi High-Technologies Corporation) was used.

Thereafter, number of defects on the defection inspection wafer was measured using "KLA2810" manufactured by KLA-Tencor Corporation. Moreover, the defects determined with "KLA2810" were classified into those decided to be derived from the resist film, and from foreign substances. After the classification, the total of number decided to be derived from the resist film (number of defects) was calculated in terms of number of defects per 1 cm² of the resist film (defects/cm²). With respect to the development defect inhibitory ability, evaluation was made as: "A" when the number of defects is no greater than 10 defects/cm²; "B" when the number was greater than 10 defects/cm² and no greater than 50 defects/cm²; and "C" when the number was greater than 50 defects/cm².

As shown in Table 2-1 and Table 2-2, the radiation sensitive resin compositions of Example 3-1 to Example 3-21 bridge defect, occurrence of development defects such as blob defects was significantly inhibited as compared with the radiation sensitive resin compositions of Comparative Examples 3-1 to 3-8, revealing that the compositions of Examples were superior in development defect inhibitory ability. In addition, the radiation sensitive resin composition of Examples had a receding contact angle of less than 35° after the alkali development, indicating that the affinity to a developer solution after the alkali development was improved as compared with the radiation sensitive resin composition of Comparative Examples.

When the radiation sensitive resin composition of the embodiment of the present invention is used, occurrence of development defects such as blob defects and bridge defects can be inhibited, and thus formation of favorable fine patterns is enabled. Therefore, the radiation sensitive resin composition can be suitably used in resist pattern formation in a lithography process of various types of electronic devices such as semiconductor devices and liquid crystal devices.

Obviously, numerous modifications and variations of the present invention are possible in light of the above teachings. It is therefore to be understood that within the scope of the appended claims, the invention may be practiced otherwise than as specifically described herein.

The invention claimed is:

1. A radiation sensitive resin composition comprising:
a first polymer having a group represented by a following formula (1); and
a radiation sensitive acid generator,

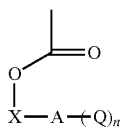
(1)

wherein in the formula (1),
n is an integer of 2 to 4,
X represents a single bond or a bivalent organic group,
A represents an (n+1) valent linking group, and
each Q independently represents a group that includes an alkali-dissociable group and that is represented by a following formula (2-2):

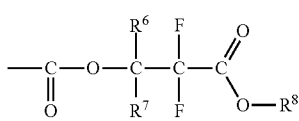
(2-2)

wherein in the formula (2-2),
each of $R^6$ and $R^7$ independently represents a hydrogen atom or a chain hydrocarbon group having 1 to 10 carbon atoms, and
$R^8$ represents a monovalent organic group.

2. The radiation sensitive resin composition according to claim 1, wherein A in the formula (1) represents an alicyclic group having 4 to 20 carbon atoms, or a chain hydrocarbon group having 1 to 20 carbon atoms.

3. The radiation sensitive resin composition according to claim 1, wherein a content of structural units having the group represented by the formula (1) with respect to entire structural units that constitute the first polymer is no less than 5 mol %.

4. The radiation sensitive resin composition according to claim 1, further comprising: a second polymer which is a base polymer and which has an acid-dissociable group.

5. A method for forming a pattern, comprising:
forming a resist film by applying the radiation sensitive resin composition according to claim 1 on a substrate;
exposing at least a part of the resist film by irradiating with a radioactive ray by liquid immersion lithography;
heating the exposed resist film; and
developing the heated resist film.

6. A polymer comprising:
a group represented by a following formula (1):

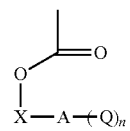
(1)

wherein in the formula (1),
n is an integer of 2 to 4,
X represents a single bond or a bivalent organic group,
A represents an (n+1) valent linking group, and
each Q independently represents a group that includes an alkali-dissociable group and that is represented by a following formula (2-2):

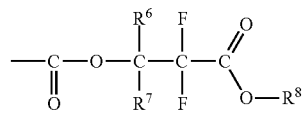
(2-2)

wherein in the formula (2-2),
each of $R^6$ and $R^7$ independently represents a hydrogen atom or a chain hydrocarbon group having 1 to 10 carbon atoms, and
$R^8$ represents a monovalent organic group.

7. The polymer according to claim 6, wherein A in the formula (1) represents an alicyclic group having 4 to 20 carbon atoms or a chain hydrocarbon group having 1 to 20 carbon atoms.

* * * * *